United States Patent
Ishihara et al.

(10) Patent No.: US 10,874,018 B2
(45) Date of Patent: Dec. 22, 2020

(54) PRINTED WIRING BOARD HAVING EMBEDDED PADS AND METHOD FOR MANUFACTURING THE SAME

(71) Applicant: IBIDEN CO., LTD., Ogaki (JP)

(72) Inventors: Teruyuki Ishihara, Ogaki (JP); Hiroyuki Ban, Ogaki (JP); Haiying Mei, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/502,170

(22) Filed: Jul. 3, 2019

(65) Prior Publication Data

US 2019/0327830 A1 Oct. 24, 2019

Related U.S. Application Data

(63) Continuation of application No. 15/681,948, filed on Aug. 21, 2017, now abandoned.

(30) Foreign Application Priority Data

Aug. 22, 2016 (JP) ................................. 2016-161870

(51) Int. Cl.
  *H05K 1/02* (2006.01)
  *H05K 3/00* (2006.01)
  (Continued)

(52) U.S. Cl.
  CPC ....... *H05K 1/0284* (2013.01); *H01L 21/4853* (2013.01); *H01L 23/49811* (2013.01);
  (Continued)

(58) Field of Classification Search
  CPC .... H05K 1/0284; H05K 1/0296; H05K 3/007; H05K 3/4682; H01L 21/4853; H01L 23/49811
  (Continued)

(56) References Cited

U.S. PATENT DOCUMENTS 8,745,860 B2 * 6/2014 Inui ........................ H05K 1/186
  29/830
2010/0263923 A1 * 10/2010 Kodani .................. H05K 1/111
  174/260

(Continued)

FOREIGN PATENT DOCUMENTS

JP 2009-224739 A 10/2009

*Primary Examiner* — Tremesha A Willis
(74) *Attorney, Agent, or Firm* — Oblon, McClelland, Maier & Neustadt, L.L.P.

(57) ABSTRACT

A printed wiring board includes a laminate including first conductor pads on first surface side of the laminate and second conductor pads on second surface side of the laminate, and a solder resist layer formed on the first surface side of the laminate and having openings formed such that the openings are exposing the first conductor pads respectively. The laminate includes a resin insulating layer and has first surface on the first surface side and second surface on the second surface side on the opposite side with respect to the first surface of the laminate, and the second conductor pads are embedded in the second surface of the laminate such that the second conductor pads have surfaces exposed from the second surfaces of the laminate respectively and that the surfaces of the second conductor pads are protruding from the second surface of the laminate.

20 Claims, 22 Drawing Sheets

(51) Int. Cl.
  *H05K 3/46* (2006.01)
  *H01L 23/498* (2006.01)
  *H01L 21/48* (2006.01)
  H05K 3/34 (2006.01)
  H05K 3/40 (2006.01)
  H05K 3/20 (2006.01)

(52) U.S. Cl.
  CPC ........... *H05K 1/0296* (2013.01); *H05K 3/007* (2013.01); *H05K 3/4682* (2013.01); *H01L 21/4857* (2013.01); *H01L 23/49822* (2013.01); *H01L 2224/16225* (2013.01); *H01L 2924/15174* (2013.01); *H05K 3/205* (2013.01); *H05K 3/3436* (2013.01); *H05K 3/4007* (2013.01); *H05K 2201/0367* (2013.01); *H05K 2201/10674* (2013.01)

(58) Field of Classification Search
  USPC ........................................................ 174/250
  See application file for complete search history.

(56) References Cited

U.S. PATENT DOCUMENTS

| | | |
|---|---|---|
| 2012/1023458 | 9/2012 | Furuichi et al. |
| 2015/0319848 A1* | 11/2015 | Furutani .............. H05K 3/4632 361/783 |
| 2017/0094797 A1 | 3/2017 | Baek et al. |

* cited by examiner

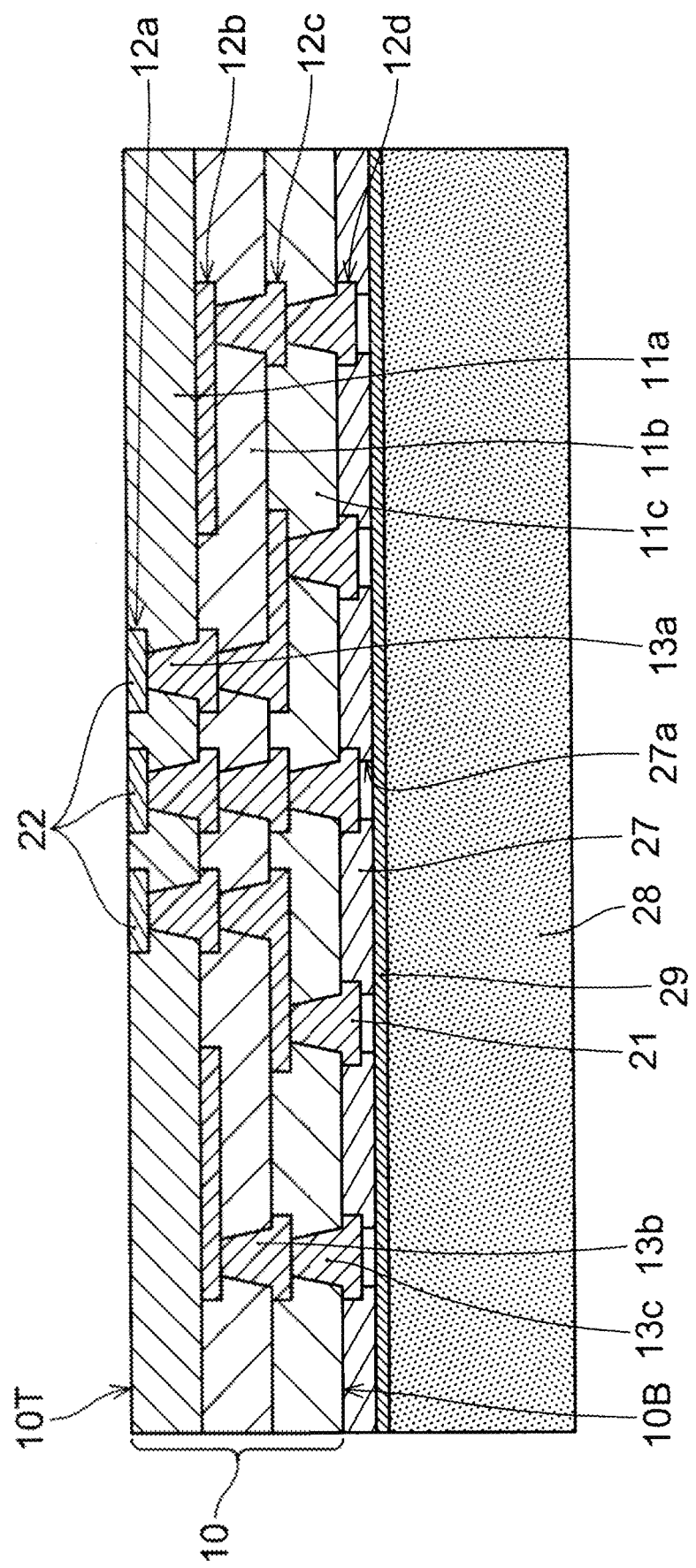

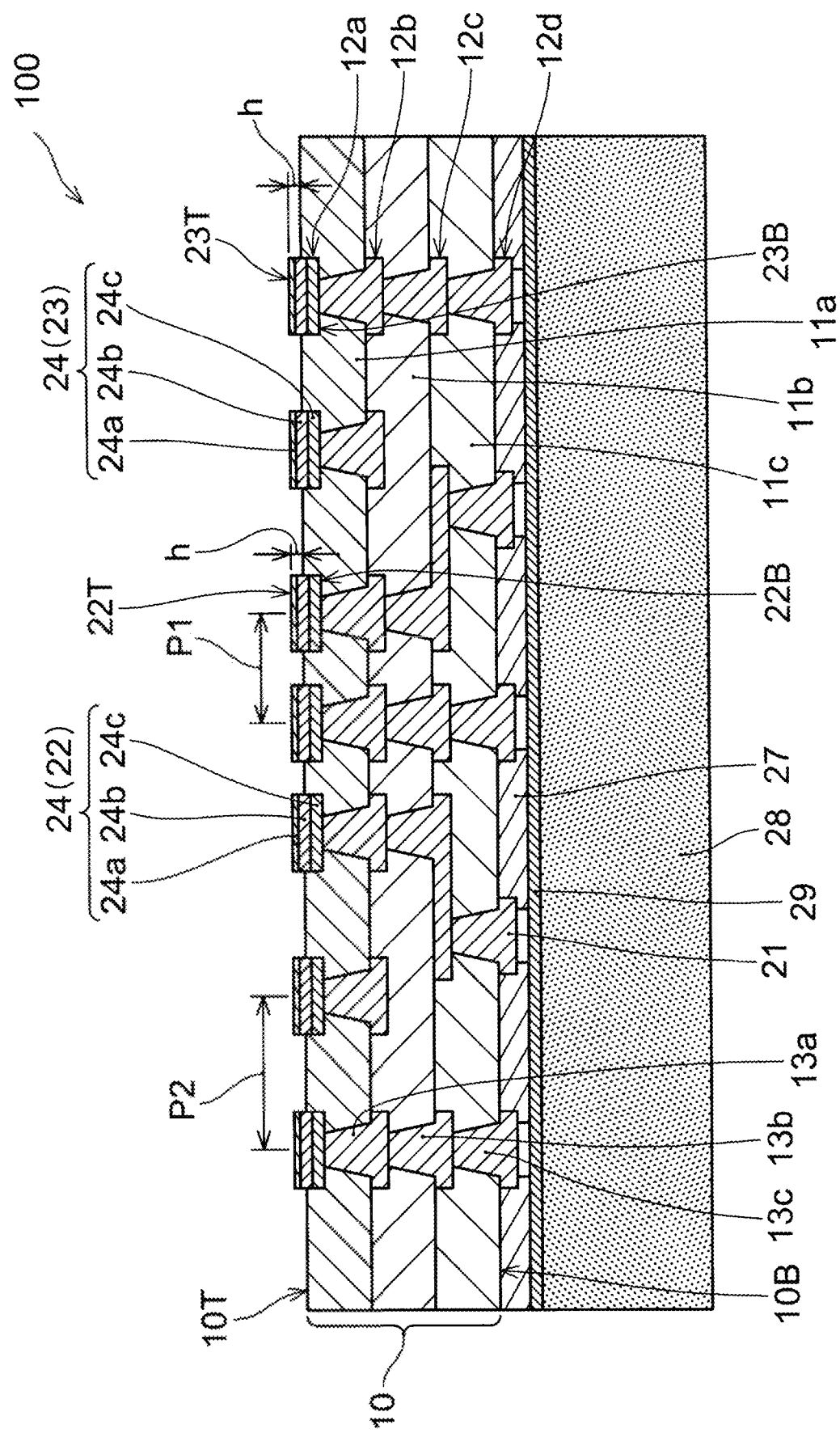

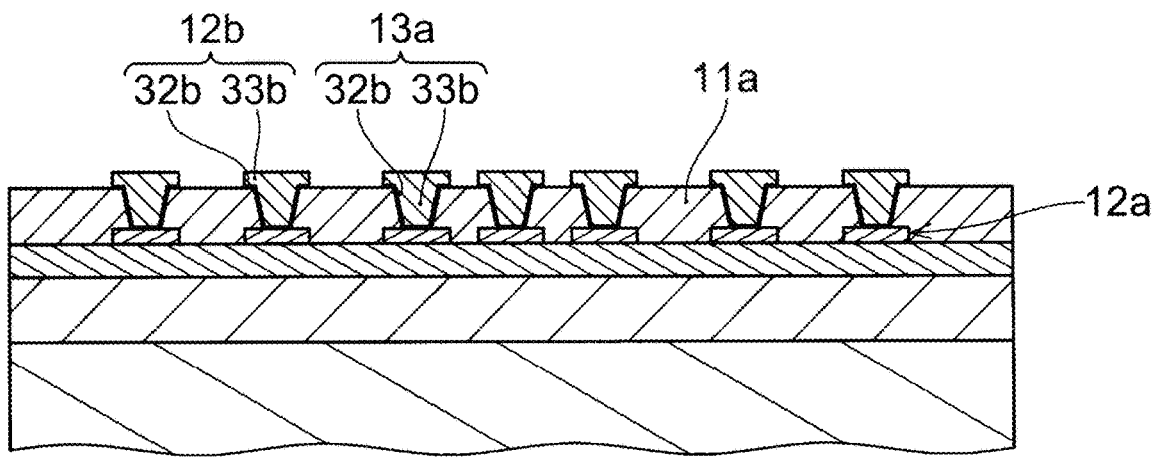
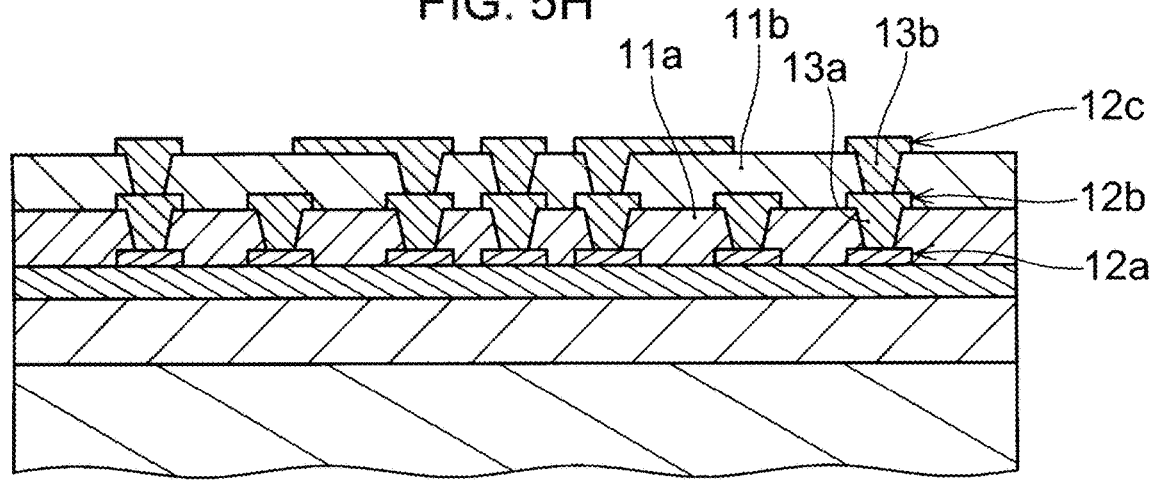
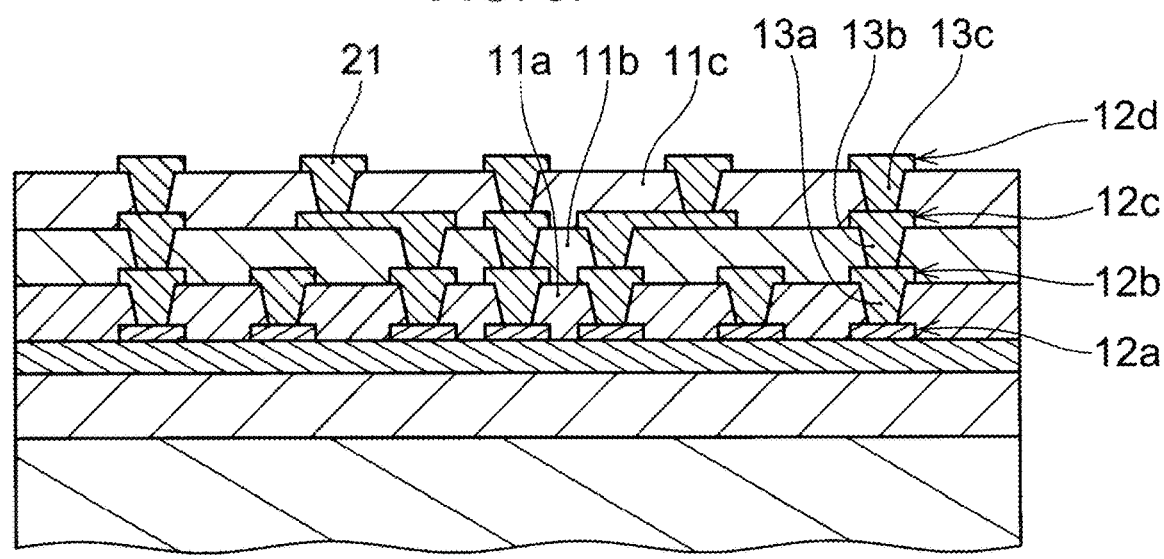

PRINTED WIRING BOARD HAVING EMBEDDED PADS AND METHOD FOR MANUFACTURING THE SAME

CROSS-REFERENCE TO RELATED APPLICATIONS

The present application is a continuation of and claims the benefit of priority to U.S. patent application Ser. No. 15/681,948, filed Aug. 21, 2017, which is based upon and claims the benefit of priority to Japanese Patent Application No. 2016-161870, filed Aug. 22, 2016. The entire contents of these applications are incorporated herein by reference.

BACKGROUND OF THE INVENTION

Field of the Invention

The present invention relates to a printed wiring board having a support plate and relates to a method for manufacturing the printed wiring board.

Description of Background Art

Japanese Patent Laid-Open Publication No. 2009-224739 describes a multilayer wiring board that does not have a core substrate. On a semiconductor element mounting surface side of the multilayer wiring board, connection pads for connecting electrodes of a semiconductor element are formed on an insulating layer that forms the mounting surface, and a protective film is formed such that the connection pads are exposed. The entire contents of this publication are incorporated herein by reference.

SUMMARY OF THE INVENTION

According to one aspect of the present invention, a printed wiring board includes a laminate including first conductor pads on first surface side of the laminate and second conductor pads on second surface side of the laminate, and a solder resist layer formed on the first surface side of the laminate and having openings formed such that the openings are exposing the first conductor pads respectively. The laminate includes a resin insulating layer and has first surface on the first surface side and second surface on the second surface side on the opposite side with respect to the first surface of the laminate, and the second conductor pads are embedded in the second surface of the laminate such that the second conductor pads have surfaces exposed from the second surfaces of the laminate respectively and that the surfaces of the second conductor pads are protruding from the second surface of the laminate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view of a printed wiring board according to an embodiment of the present invention;

FIG. 3A is cross-sectional view illustrating a printed wiring board according to yet another embodiment of the present invention;

FIG. 5G illustrates a method for manufacturing a printed wiring board according to the embodiment of the present invention;

FIG. 5H illustrates a method for manufacturing a printed wiring board according to the embodiment of the present invention;

FIG. 5I illustrates a method for manufacturing a printed wiring board according to the embodiment of the present invention;

DETAILED DESCRIPTION OF THE EMBODIMENTS

Figure 2A:
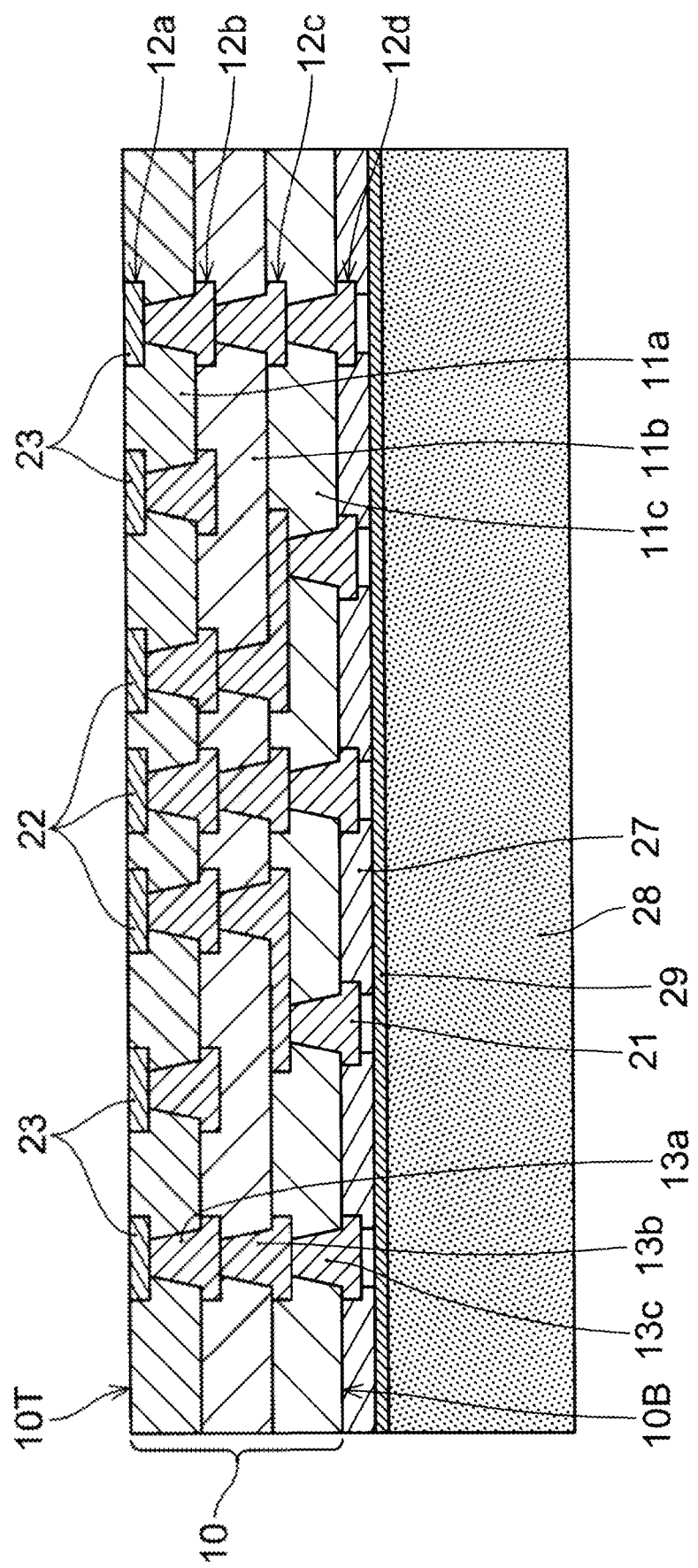
FIG. 2A is a cross-sectional view of a printed wiring board according to another embodiment of the present invention.

Embodiments will now be described with reference to the accompanying drawings, wherein like reference numerals designate corresponding or identical elements throughout the various drawings.

FIG. 1 describes a cross section of a printed wiring board 1 of the embodiment. As illustrated in FIG. 1, the printed wiring board 1 includes a laminate 10 that has a first surface (10B) and a second surface (10T) that is on the opposite side of the first surface (10B), a solder resist layer 27 that is formed on the first surface (10B), and a support plate 28 that is formed on the solder resist layer 27, the laminate 10 being formed from alternately laminated resin insulating layers (a first resin insulating layer (11a), a second resin insulating layer (11b), and a third resin insulating layer (11c)) and conductor layers (a first conductor layer (12a), a second conductor layer (12b), a third conductor layer (12c), and a fourth conductor layer (12d)). An exposed surface of the third resin insulating layer (11c) is the first surface (10B) of the laminate 10. Further, an exposed surface of the first resin insulating layer (11a) is the second surface (10T) of the laminate 10. On the first surface (10B) of the laminate 10, for example, multiple first conductor pads 21 for connecting to an electrical circuit such as an external motherboard are formed. On the second surface (10T) of the laminate 10, for example, multiple second conductor pads 22 for connecting to an electronic component (for example, an electronic component (E1); see FIG. 2B) such as a semiconductor element are formed. Examples of the electronic component include a semiconductor element, a passive element (such as a capacitor or a resistor), an interposer having a wiring layer, a semiconductor element having a rewiring layer, a WLP (Wafer Level Packages), and the like.

The solder resist layer 27 has multiple openings (27a) that respectively expose the first conductor pads 21. As illustrated in FIG. 1, the first conductor pads 21 are formed on the first surface (10B) without being embedded in the third resin insulating layer (11c) that fortes the first surface (10B) of the laminate 10. That is, the first conductor pads 21 are formed protruding on the first surface (10B). An outer peripheral portion of each of the first conductor pads 21 is covered by the solder resist layer 27. The openings (27a) may be provided to each have a size such that an entire surface of each of the first conductor pads 21 is exposed. The first conductor pads 21 can be formed at any positions required for connecting to an external electrical circuit or the like. Since the solder resist layer 27 covers edge portions of the first conductor pads 21, in the connection between the first conductor pads 21 and an external electrical circuit, occurrence of a short-circuit defect due to solder or the like between the first conductor pads 21 is suppressed.

The solder resist layer 27 can be formed of, for example, a photosensitive epoxy resin or polyimide resin. In the example of FIG. 1, the second surface (10T) of the laminate 10 is exposed without being covered by a solder resist. However, different from the example of FIG. 1, it is also possible that a solder resist layer is also provided on the second surface (10T) of the laminate 10. Occurrence of a short-circuit defect on the second surface (10T) of the laminate 10 can be suppressed.

A support plate 28 is provided on the first surface (10B) of the laminate 10 via the solder resist layer 27. The printed wiring board 1 including the laminate 10 is supported by the support plate 28. For example, connection of an electronic component such as a semiconductor element to the printed wiring board 1 via the second conductor pads 22 is facilitated. Warpage or deflection of the printed wiring board 1 can be suppressed. Flatness of a mounting surface of the printed wiring board 1 is improved, and good connection reliability between the printed wiring board 1 and an electronic component or the like can be obtained. Further, the support plate 28 can suppress warpage or deflection of the printed wiring board during a manufacturing process. Handling of the printed wiring board during a manufacturing process is facilitated. The support plate 28 can be removed, for example, after an electronic component is mounted on the printed wiring board 1. That is, handleability of the printed wiring board 1 can be improved without causing an increase in a thickness of the printed wiring board 1 during use. Further, when the first conductor pads 21 are connected to an external electrical circuit, the support plate 7 can be removed before the connection. It is also possible that only predetermined first conductor pads 21 to be connected to an external electrical circuit are exposed.

As will be described later, the support plate 28 can be provided on the first surface (10B) of the laminate 10 via the solder resist layer 27 after the conductor layers and the resin insulating layers in the laminate 10 are formed. Therefore, the support plate 28 can be attached to the laminate 10, for example, after performing an energization inspection of an electrical circuit (not illustrated in the drawings) formed by conductor patterns of the conductor layers. That is, it is possible to provide a support plate 28 only for a laminate 10 that is determined to be non-defective by an energization inspection. Then, an electronic component can be mounted on the laminate 10 that is supported by the support plate 28 and has proper energizing performance.

An adhesive layer 29 is formed of an adhesive capable of closely adhering the support plate 28 and the solder resist layer 27 to each other. For example, a material capable of developing a stronger adhesive force with respect to the support plate 28 than with respect to the solder resist layer 27 and the first conductor pads 21 can be used as the adhesive. Thereby, the printed circuit board 1 is properly supported by the support plate 28 and, for example, the support plate 28 can be easily removed when connecting the first conductor pads 21 to an external electrical circuit.

The laminate 10 has a laminated structure similar to that of a so-called build-up part in a build-up wiring board. In the example of FIG. 1, from the second surface (10T) side of the laminate 10 toward the first surface (10B) side, sequentially, the first conductor layer (12a), the first resin insulating layer (11a), the second conductor layer (12b), the second resin insulating layer (11b), the third conductor layer (12c), the third resin insulating layer (11c), and the fourth conductor layer (12d) are laminated. A surface of the first resin insulating layer (11a) on the opposite side of the second conductor layer (12b) side font's the second surface (10T) of the laminate 10. The first conductor layer (12a) includes the second conductor pads 22. The first conductor layer (12a) is formed, for example, by electrolytic plating using a plating resist having openings at formation regions of predetermined conductor patterns. Since etching is not used, the conductor patterns such as the second conductor pads 22 can be formed at a fine pitch in the first conductor layer (12a).

The first conductor layer (12a) is embedded in the first resin insulating layer (11a) with one surface of the first conductor layer (12a) exposed on the second surface (10T) of the laminate 10. In this way, embedding the first conductor layer (12a) in the first resin insulating layer (11a) contributes to reduction in thickness of the printed wiring board. Further, adhesion between the first conductor layer (12a) and the first resin insulating layer (11a) is improved. In the example of FIG. 1, side surfaces of the second conductor pads 22 formed on the second surface (10T) of the laminate 10 are covered by the first resin insulating layer (11a). Contact of a bonding material such as solder between adjacent conductor pads is unlikely to occur. Even when the conductor pads are formed at a fine pitch, a short-circuit defect is unlikely to occur.

FIG. 2A is a cross-sectional view, similar to FIG. 1, illustrating another embodiment of the present invention. A structural element that is the same as an element in the printed wiring board 1 of the above embodiment is indicated using the same reference numeral symbol, and description about the structural element is omitted. In a printed wiring board 2 of the another embodiment, in addition to the multiple second conductor pads 22 formed on a center side of the second surface (10T) of the laminate 10, the first conductor layer (12a) includes multiple third conductor pads 23 formed on an outer peripheral side of the second surface (10T). The third conductor pads 23 are embedded in the first resin insulating layer (11a), one surface of each of the third conductor pads 23 being exposed from the second surface (10T) of the laminate 10. The third conductor pads 23 are connected to, for example, an external wiring board or a relatively large electronic component or the like. Examples of the external wiring board include a motherboard, a wiring board of a package of an external electronic component, and the like. The printed wiring board 2 also includes the support plate 28 provided on the first surface (10B) of the laminate 10 via the solder resist layer 27. Since the printed wiring board 2 is supported by the support plate 28, for example, even when conductor posts are formed on the third conductor pads 23 in order to connect the printed wiring board 2 of the embodiment to a motherboard or another printed wiring board or the like, the formation of the conductor posts is facilitated.

Figure 2B:
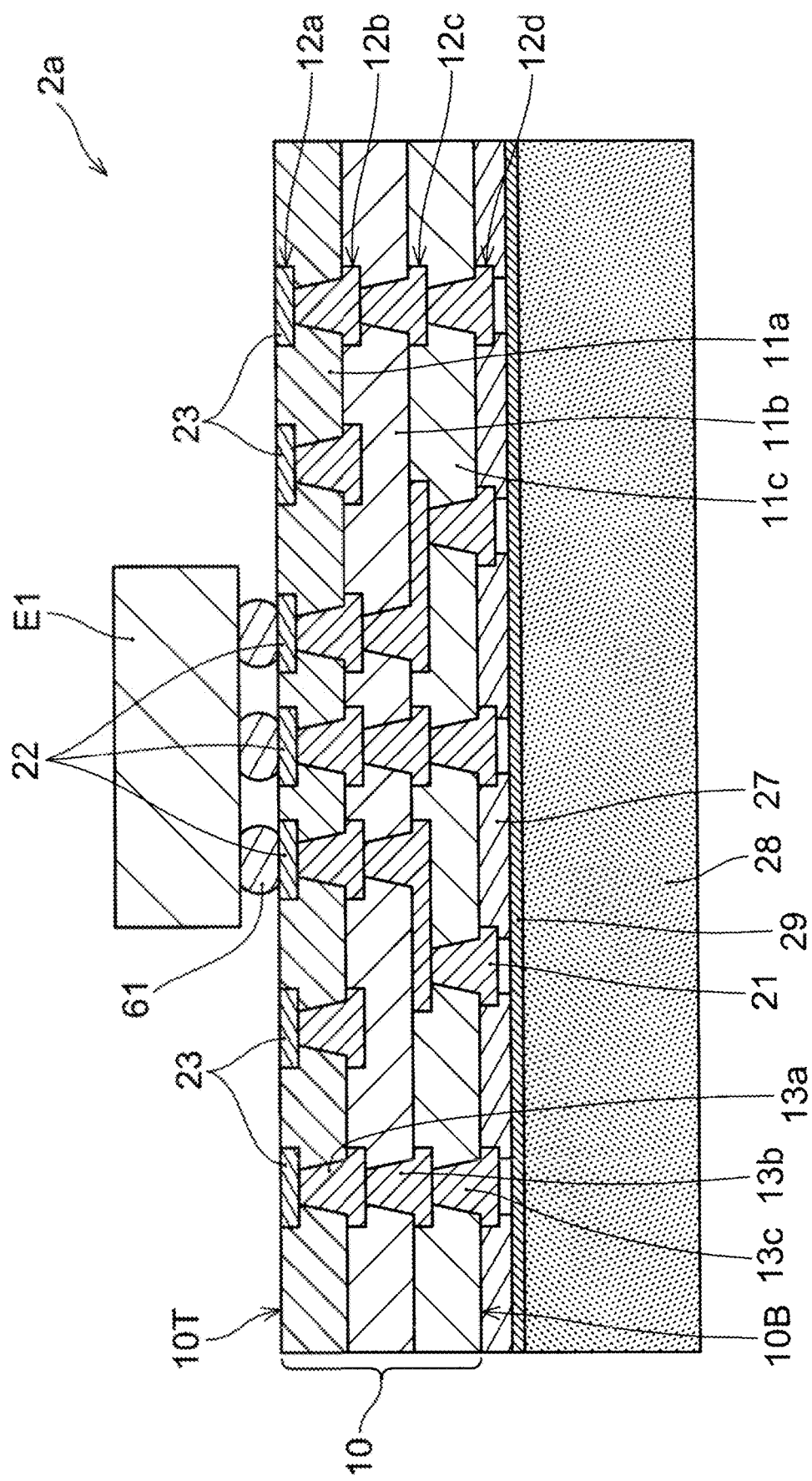
FIG. 2B illustrates a printed wiring board according to an embodiment of the present invention in which an electronic component is mounted.

FIG. 2B illustrates a printed wiring board (2a) having an electronic component (E1) connected to the second conductor pads 22 of the printed wiring board 2. Due to the support plate 28 provided on the first surface (10B), warpage or deflection of the printed wiring board (2a) is suppressed. Therefore, when the electronic component (E1) is mounted, multiple electrodes of the electronic component (E1) can be respectively substantially uniformly brought close to the multiple second conductor pads 22. The electrodes of the electronic component (E1) are unlikely to float from the second conductor pads 22. Terminals of the electronic component (E1) are respectively connected to exposed surfaces of the second conductor pads 22 on the opposite side of the first surface (10B) via bonding members 61 formed of solder or the like. The third conductor pads 23 are not yet connected to an external element, but can be connected to any external element such as an electronic component different from the electronic component (E1). A BGA or the like having a large size has connection pads that are arrayed at a relatively large pitch, and a CSP, a bare chip or the like having a small size has connection pads that are arrayed at a relatively small pitch. For example, a semiconductor element or the like of a CSP or bare chip type is mounted as the electronic component (E1) on the second conductor pads 22. Then, a BGA (not illustrated in the drawings) or the like having terminals only on an outer peripheral portion thereof may be mounted on the third conductor pads 23 having a larger pitch than the second conductor pads 22 in a manner straddling over the electronic component (E1). An electronic component of a package-on-package type including multiple semiconductor devices or the like that are hierarchically mounted can be formed. In this way, in the printed wiring board (2a), electronic components can be mounted at a high density. Or, it is also possible that one electronic component is mounted on the second and third conductor pads (22, 23). Further, instead of an electronic component, a motherboard of an electrical device in which the printed wiring board 2 is used, or an external wiring board such as a wiring board of a package of an external electronic component, may be connected to the second and third conductor pads (22, 23).

In the example illustrated in FIGS. 1 and 2A, the laminate 10 include three resin insulating layers and a total of four conductor layers that are respectively formed on surfaces of the resin insulating layers. That is, FIGS. 1 and 2A illustrate examples of so-called four-layered laminates 10. However, the number of the resin insulating layers and the number of the conductor layers are not limited to the examples of FIGS. 1 and 2A, and can be appropriately selected according to a structure of a circuit formed in the printed wiring board (1 or 2). The laminate 10 may include only one resin insulating layer and conductor layers that are respectively provided on both sides the resin insulating layer, or may include more than four conductor layers. By allowing the laminate 10 to include more conductor layers, without increasing a planar size of the printed wiring board (1 or 2), a larger and more complex electrical circuit can be formed in the printed wiring board (1 or 2). Further, it is also possible that the laminate 10 is formed by laminating some conductor layer and a resin insulating layer at one time rather than forming the conductor layer and the resin insulating layer one by one as in a build-up wiring board.

First via conductors (13a), second via conductors (13b), and third via conductors (13c) respectively connect between the first conductor layer (12a) and the second conductor layer (12b), between the second conductor layer (12b) and the third conductor layer (12c), and between the third conductor layer (12c) and the fourth conductor layer (12d). The first via conductors (13a), the second via conductors (13b), and the third via conductors (13c) are respectively formed in the first resin insulating layer (11a), the second resin insulating layer (11b), and the third resin insulating layer (11c). As will be described later, the via conductors are respectively formed in conduction holes that are each formed, for example, by irradiating a laser beam to one side of a respective resin insulating layer. The conduction holes each have a diameter that is larger on a laser beam irradiation side and become smaller on a deep side (opposite side of the laser beam irradiation side). In the example illustrated in FIG. 1, since the laser beam is irradiated from a lower side in the drawing, the diameter (width) on the lower side of each of the conduction holes is larger and the diameter (width) on an upper side is smaller. Therefore, the via conductors that are respectively formed in the conduction holes also each have a width (diameter) that is larger on a lower side and is smaller on an upper side. In the example illustrated in FIG. 1, the via conductors are each formed in a tapered shape that is gradually reduced in diameter from the first surface (10B) toward the second surface (10T) of the laminate 10. The reduced diameter sides of the tapered shapes of the first via conductors (13a) are connected to the second conductor pads 22 or the third conductor pads 23 of the first conductor layer (12a). End surfaces of the third via conductors (13c) on the first surface (10B) side of the laminate 10 are connected to the first conductor pads 21 of the fourth conductor layer (12d). Some of the first, second and third via conductors (13a, 13b, 13c), such as those via conductors on a left edge side and a right edge side in FIG. 2A, may be formed at overlapping positions in a plan view to form so-called stack vias. Thereby, an external electronic component connected to the second conductor pads 22, and an external electrical circuit connected to the third conductor pads 23, can be electrically connected to an external motherboard or the like on the first conductor pads 21 side with a short path.

For example, as in the example of FIG. 1, when the laminate 10 includes multiple resin insulating layers, preferably, the resin insulating layers (the first, second and third resin insulating layers (11a, 11b, 11c)) are formed of the same resin material. However, it is also possible that mutually different resin materials are used. The resin insulating layers can each be formed, for example, by applying heat and pressure to a resin material such as a film for interlayer insulation. Or, the material of each of the resin insulating layers may be a prepreg in a semi-cured state obtained by impregnating a core material such as glass fiber with a resin material. Warping due to a difference in thermal expansion coefficient with respect to the electronic component can be easily prevented. A preferred example of the resin material is an epoxy resin. The epoxy resin may contain inorganic filler such as silica ($SiO_2$) or alumina. The resin insulating layers (11a, 11b, 11c) each have a thickness of, for example, 3 μm or more and 25 μm or less.

As will be described later, the conductor layers (first, second, third and fourth conductor layers (12a, 12b, 12c, 12d) are each formed, for example, by electrolytic plating. By using a so-called semi-additive method, fine patterns are precisely formed. As a result, in particular, requirements for a high density and a fine pitch are satisfied. An example of a material of the conductor layers formed by electrolytic plating is copper. The material of the conductor layers may also be other metals such as nickel. The first-fourth conductor layers (12a, 12b, 12c, 12d) each have a thickness of, for example, 3 μm or more and 20 μm or less.

Further, although not illustrated in FIGS. 1 and 2A, it is also possible that the second and third conductor pads (22, 23) are each formed from two or more metal layers composed of different metals. For example, the second conductor pads 22 and/or third conductor pads 23 are each formed such that a corrosion resistant plating layer composed of highly corrosion resistant gold is exposed from the second surface (10T) of the laminate 10. Corrosion resistance of the conductor pads is likely to be improved. An example of a manufacturing method will be described later.

FIG. 3A is a cross-sectional view, similar to FIG. 2A, illustrating yet another embodiment of the present invention. In this printed wiring board 100, similar to the printed wiring board 2 of FIG. 2A, the second conductor pads 22 are formed on a center side of the second surface (10T) of the laminate 10, and the third conductor pads 23 are formed on an outer peripheral side of the second surface (10T). The second conductor pads 22 and the third conductor pads 23 are each formed of a dissimilar metal layer 24 that is formed by laminating two or more layers composed of mutually different metals. The second conductor pads 22 and the third conductor pads 23 are each formed protruding from the second surface (10T). Mounting of an electronic component or the like on the printed wiring board 100 is facilitated. The second conductor pads 22 and the third conductor pads 23 are embedded in the first resin insulating layer (11a), and a portion of each of the second conductor pads 22 and the third conductor pads 23 is exposed from the first resin insulating layer (11a).

In the example illustrated in FIG. 3A, the dissimilar metal layer 24 is formed by sequentially laminating three metal layers including, from a side farthest from the first surface (10B), a first metal layer (24a), a second metal layer (24b) and a third metal layer (24c) in a thickness direction of the laminate 10. The first-third metal layers (24a-24c) are preferably each formed by a plating film. For example, the first-third metal layers (24a-24c) are each an electrolytic plating film.

In the example illustrated in FIG. 3A, the dissimilar metal layer 24 is formed form three layers including the first metal layer (24a) composed of gold, the second metal layer (24b) composed of nickel, and the third metal layer (24c) composed of copper. The first metal layer (24a) is an outermost layer of each of the second conductor pads 22 and the third conductor pads 23 on the opposite side of the first surface (10B). However, the number of layers of the dissimilar metal layer 24 is not limited to this example. For example, it is also possible that an additional metal layer is formed between the first metal layer (24a) and the second metal layer (24b), and the dissimilar metal layer 24 is formed by four or more metal layers. For example, an additional metal layer can be formed of a metal layer composed of palladium. The dissimilar metal layer 24 may be a metal layer having a multilayer structure formed by laminating at least two layers composed of mutually different metals. For example, the dissimilar metal layer 24 can be formed from a metal layer that is formed by a copper plating film on the first surface (10B) side and a corrosion resistant metal layer that is laminated on the metal layer. The dissimilar metal layer 24 can be formed such that, for example, the first metal layer (24a) has a thickness of 0.3 μm or more and 1 μm or less, the second metal layer (24b) has a thickness of 3 μm or more and 7 μm or less, and the third metal layer (24c) has a thickness of 4 μm or more and 6 μm or less. However, it is also possible that the metal layers have the same thickness. Preferably, as illustrated in FIG. 3A, the first metal layer (24a), which is the outermost layer, is formed thinnest.

The first metal layer (24a), which is the outermost layer, is preferably formed of metal having low contact resistance and high corrosion resistance. Therefore, the first metal layer (24a) is preferably a highly corrosion resistant gold plating layer. Corrosion resistance and oxidation resistance of the second and third conductor pads (22, 23) are improved. For example, during mounting of an electronic component or the like, a solder failure caused by oxidation of the conductor pads is unlikely to occur.

In the printed wiring board 100 of the embodiment, the metal layers in each of the dissimilar metal layers 24 that respectively form the second conductor pads 22 and the third conductor pads 23 are each formed by electrolytic plating. Therefore, variation in heights of the formed multiple dissimilar metal layers 24 is small. As a result, for example, variation in distances between electrodes of an electronic component (E2) (see FIG. 3B) such as a semiconductor element to be mounted on the printed wiring board 100 and upper surfaces (22T) of the second conductor pads 22 on the opposite side of the first surface (10B) is reduced. High reliability in the connection between the electronic component (E2) and the second conductor pads 22 can be provided.

As illustrated in FIG. 3A, the upper surfaces (22T) of the second conductor pads 22 and upper surfaces (23T) of the third conductor pads 23 on the opposite side of the first surface (10B) are formed protruding from the second surface (10T) of the laminate 10. Lower surfaces (22B) of the second conductor pads 22 on the first surface (10B) side and lower surfaces (23B) of the third conductor pads 23 on the first surface (10B) are embedded in the first resin insulating layer (11a), and are respectively connected to the first via conductors (13a).

In the example of FIG. 3A, among the three metal layers (24a-24c) of the dissimilar metal layer 24, the first metal layer (24a) and a portion of the second metal layer (24b) protrude from the second surface (10T) of the laminate 10. By these metal layers, a protruding portion of each of the second conductor pads 22 and the third conductor pads 23 that protrudes from the second surface (10T) is formed. The remaining portion of the second metal layer (24b) and the third metal layer (24c) are embedded in the first resin insulating layer (11a). That is, the second surface (10T) of the laminate 10 is not flush with any interface between the metal layers in the dissimilar metal layer 24. Even when an external force in a surface direction of the second surface (10T) is applied to the protruding portions of the second and third conductor pads (22, 23), a crack or peeling is unlikely to occur in portions of side surfaces of the second and third conductor pads (22, 23) in contact with the second surface (10T).

A height of the protruding portion of each of the second conductor pads 22 relative to the second surface (10T) is substantially equal to a height of the protruding portion of each of the third conductor pads 23 relative to the second surface (10T). Therefore, in FIG. 3A, the height of the protruding portion of each of the second conductor pads 22 and the height of the protruding portion of each of the third conductor pads 23 are indicated using the same reference symbol "h." The height (h) of the protruding portion of each of the second conductor pads 22 and the third conductor pads 23 relative to the second surface (10T) is, for example, 2 μm or more and 10 μm or less. When the height (h) is such a length, mounting of the electronic component (E2) to the second conductor pads 22 is facilitated. A mounting yield of the electronic component (E2) is expected to be high. Further, a stress caused by a difference between a thermal expansion coefficient of the electronic component (E2) and a thermal expansion coefficient of the printed wiring board 100 can be relaxed.

However, it is also possible that the height (h) exceeds or falls below the above-described range. Further, the number of the plating layers that form the protruding portion is also not limited to the above-described example. For example, it is also possible that the second and third conductor pads (22, 23) are each formed by a dissimilar metal layer 24 that is formed such that only the first metal layer (24a) protrudes from the second surface (10T). That is, it is also possible that the second surface (10T) is flush with an interface between the metal layers that form the dissimilar metal layer 24. Even in this case, in the printed wiring board 100 of the embodiment, the dissimilar metal layer 24 is foil red by laminating the plating layers. Therefore, the plating layers are firmly bonded to each other and peeling or breaking at an interface between the plating layers is unlikely to occur.

The height (h) of the protruding portion of each second conductor pad 22 and the third conductor pads 23 relative to the second surface (10T) can be adjusted by a depth (d) (see FIG. 6A) of recesses (53a) of a metal film 53 for forming the dissimilar metal layers 24. A metal layer portion that forms the protruding portion of each of the second conductor pads 22 and the third conductor pads 23 that protrudes from the second surface (10T), that is, the protruding portion of the dissimilar metal layer 24, is formed in each of the recesses (53a) (see FIG. 6B). Thicknesses of metal layers may be adjusted according to the depth (d) of the recesses (53a). For example, a dissimilar metal layer 24 may be formed in which two or more metal layers are laminated and thicknesses of the metal layers are adjusted such that a desired metal layer is included in the protruding portion of the dissimilar metal layer 24 having a predetermined height (h). In FIG. 3A, the dissimilar metal layers 24 of the second conductor pads 22 and the third conductor pads 23, and the metal layers (24a-24c) in each of the dissimilar metal layers 24, are enlarged in the thickness direction of the second conductor pads 22 and the third conductor pads 23 to facilitate understanding of the features.

In the example of FIG. 3A, a pitch (P1) between the second conductor pads 22 is smaller than a pitch (P2) between the third conductor pads 23. A semiconductor element or the like in which a terminal pitch is not widened by a rewiring layer such as an interposer can be directly mounted on the second conductor pads 22. Here, the term "pitch" refers to a distance between centers of adjacent conductor pads or the like. As will be described later, the second conductor pads 22 and the third conductor pads 23 can be arrayed according to the electronic component (E2) or an external wiring board to be mounted on the printed wiring board 100 of the embodiment.

The number of the second conductor pads 22 and the number of the third conductor pads 23 are not limited to the numbers illustrated in FIG. 3A. For example, the second conductor pads 22 in a number corresponding to the number of electrodes of an electronic component to be connected to the second conductor pads 22 can be fondled in a layout corresponding to the formation of the electrodes of the electronic component.

Figure 3B:
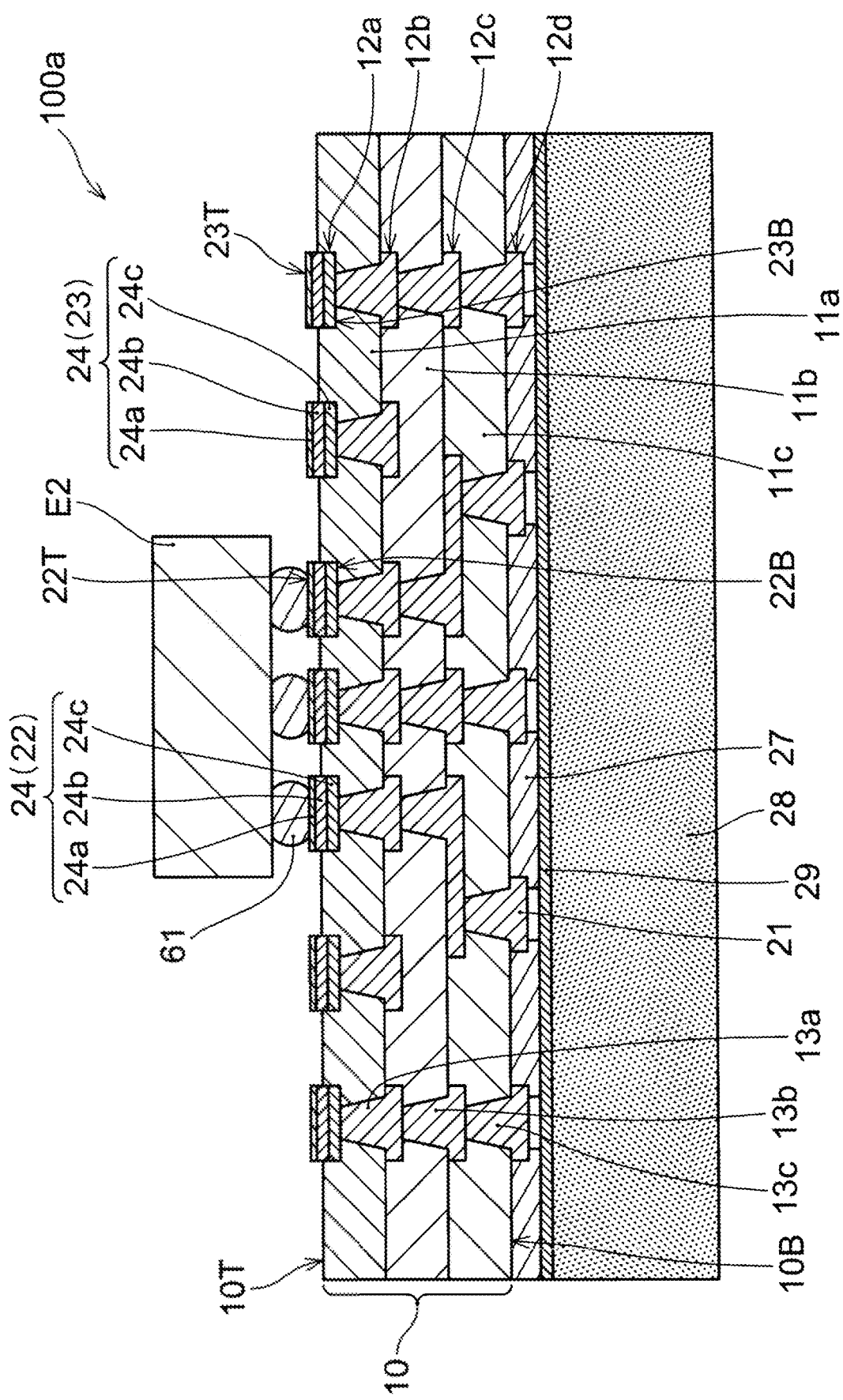
FIG. 3B illustrates a printed wiring board according to yet another embodiment of the present invention in which an electronic component is mounted.

FIG. 3B illustrates an example of a printed wiring board (100a) that includes the electronic component (E2) connected to the second conductor pads 22. Similar to the example illustrated in FIG. 2B, terminals of the electronic component (E2) are respectively connected, for example, via bonding members 61 composed of solder or the like, to the upper surfaces (22T) of the second conductor pads 22 formed from the dissimilar metal layers 24. Similar to the example illustrated in FIG. 2B, the electronic component (E2) is, for example, a semiconductor element, a passive element or the like. Another electronic component other than the electronic component (E2), or another printed wiring board (not illustrated in the drawings) or the like, for example, can be connected to the third conductor pads 23.

Figure 4A:
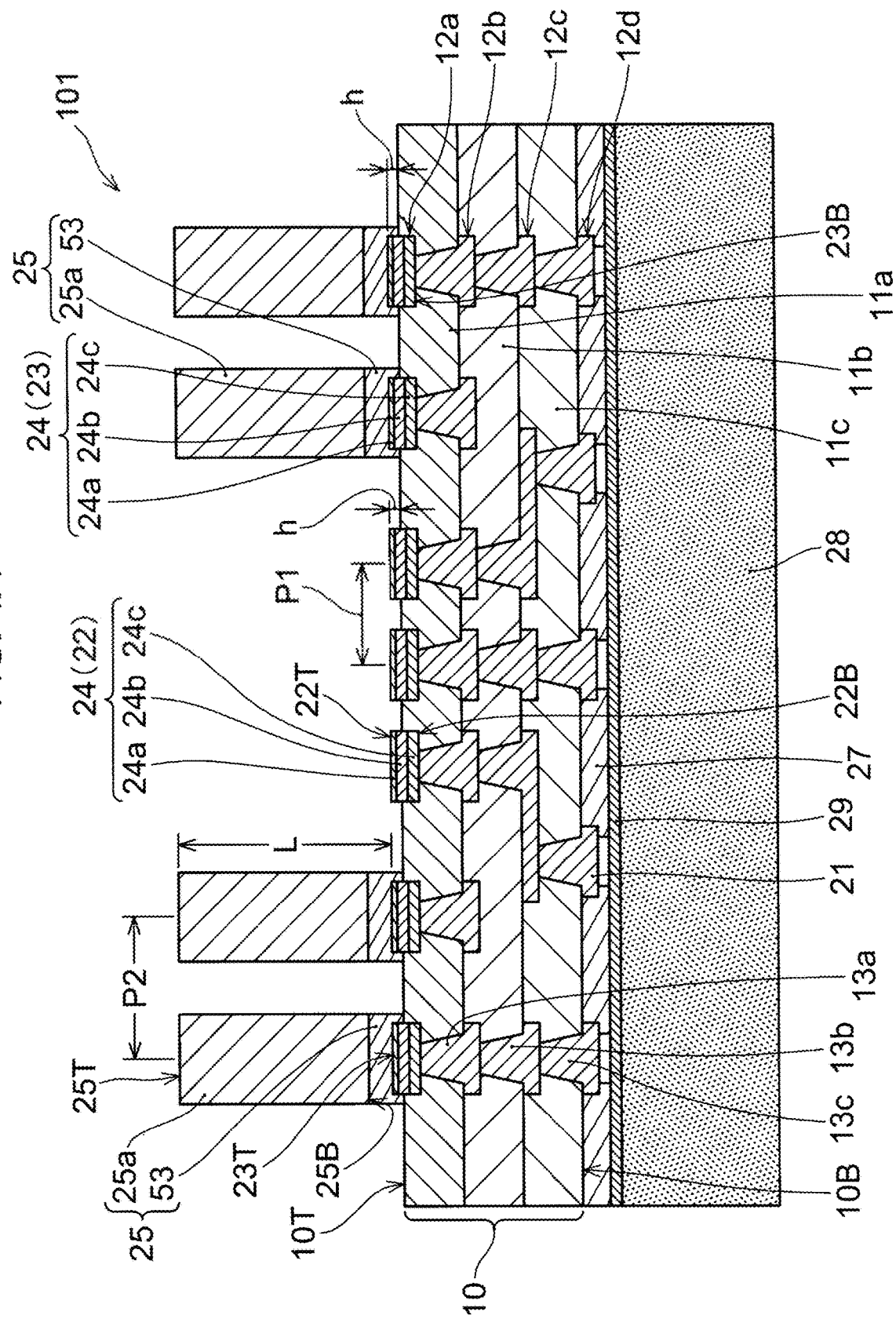
FIG. 4A is cross-sectional view illustrating a printed wiring board according to still another embodiment of the present invention.

As illustrated in FIG. 4A, the printed wiring board 100 of the embodiment may further include conductor posts 25 that are formed on the third conductor pads 23. A printed wiring board 101 illustrated in FIG. 4A can be connected, for example, to another printed wiring board or the like (not illustrated in the drawings) via the conductor posts 25.

According to the embodiment illustrated in FIG. 4A, the second conductor pads 22 that connect an electronic component (E3) such as a semiconductor element (see FIG. 4B), and the third conductor pads 23 and the conductor posts 25 on the third conductor pads 23 that connect an external electronic component or wiring board (not illustrated in the drawings), are respectively formed by plating. Fine pitches in the printed wiring board 101 can be achieved. A package-on-package having a high degree of integration and highly reliable internal connection parts can be provided.

In the example of FIG. 4A, the conductor posts 25 each include a metal film 53 covering the upper surface (23T) of the third conductor pad 23, and a plating film (25a) formed on the metal film 53 by electrolytic plating. The metal film 53 is formed of, for example, a metal foil such as a copper foil or a nickel foil. The plating film (25a) can be preferably formed of the same material as the metal film 53 by electrolytic plating using the metal film 53 as a seed layer. The plating film (25a) is, for example, a copper plating film. The conductor posts 25 each have an end surface (25T) on the opposite side of the third conductor pad 23 side. An external wiring board or the like is mounted on the end surfaces (25T) of the conductor posts 25. In the example of FIG. 4A, straight lines that respectively pass through centers of the upper surfaces (23T) of the third conductor pads 23 and are perpendicular to the upper surfaces (23T) respectively pass through centers of the end surfaces (25T) of the conductor posts 25. The conductor posts 25 are formed such that the conductor posts 25 are respectively positioned at substantially centers of the third conductor pads 23. Therefore, a pitch of the conductor posts 25 is equal to the pitch (P2) of the third conductor pads 23.

The conductor posts 25 can be connected to any conductor pads in the laminate 10 via the third conductor pads 23. A first via conductor (13a) connected to a third conductor pad 23 bonded to a conductor post 25, and a second via conductor (13b) and a third via conductor (13c), may be formed at overlapping positions in a plan view to form a so-called stack via. That is, a conductor post 25, a third conductor pad 23, a first via conductor (13a), a second via conductor (13b), a third via conductor (13c), and a first conductor pad 21 may all be formed at overlapping positions in a plan view. For example, all of these may be substantially coaxially formed. An external wiring board or the like connected to the end surfaces (25T) of the conductor posts 25 can be electrically connected to an external motherboard or the like on the first conductor pads 21 side with a short path.

The metal films 53 respectively cover the upper surfaces (23T) of the third conductor pads 23 and side surfaces of the protruding portions of the third conductor pads 23 that protrude from the second surface (10T). That is, not only the upper surface (23T) but also the side surface of the protruding portion of each third conductor pad 23 is bonded to the metal film 53. Peeling or the like of the metal films 53 is unlikely to occur. Reliability of the printed wiring board 101 is high.

The conductor posts 25 each have a diameter of, for example, 50 μm or more and 150 μm or less. In the example of FIG. 4A, the diameter of the end surface (25T) of each of the conductor posts 25 is larger than a diameter of the upper surface (23T) of each of the third conductor pads 23. The term "diameter" is used for convenience. However, a planar shape of each of the conductor pads or the conductor posts is not limited to a circle or an ellipse. The conductor pads or the conductor posts can each have any planar shape. Therefore, the term "diameter" of the end surface (25T) of each of the conductor posts 25 or the like refers to a maximum value among distances between two points on an outer circumference of the end surface (25T) or the like.

Figure 4B:
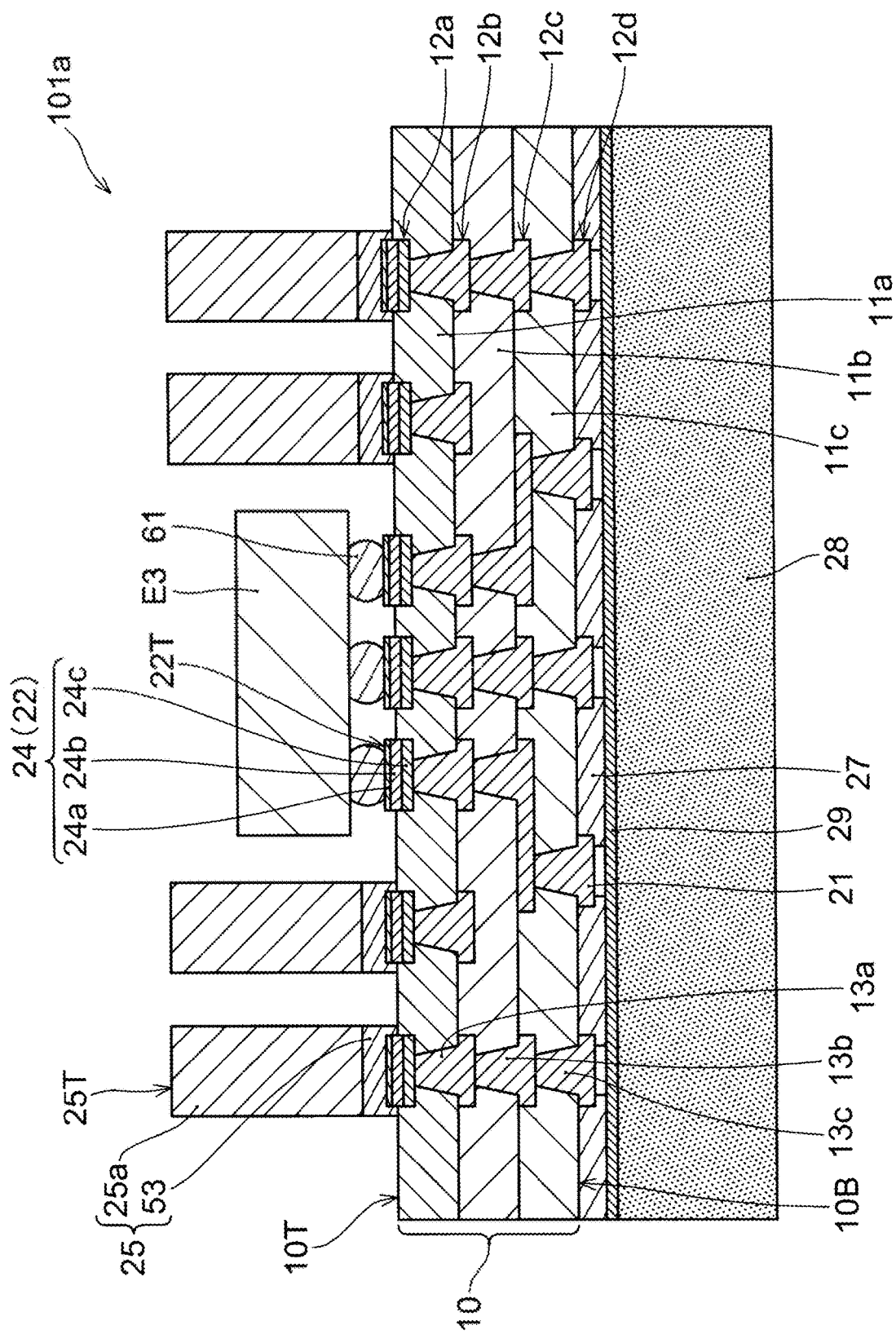
FIG. 4B illustrates a printed wiring board according to still another embodiment of the present invention in which an electronic component is mounted.

The conductor posts 25 each have a length (L). The length (L) is, for example, 50 μm or more and 200 μm or less. Since the length (L) of each of the conductor posts 25 is such a predetermined length, a stress caused by a difference between a thermal expansion coefficient of an external wiring board or electronic component connected to the conductor posts 25 and a thermal expansion coefficient of the printed wiring board 101 is relaxed by the conductor posts 25. Even when the printed wiring board 101 in a package-on-package is subjected to heat cycles, connection between an external wiring board connected to the conductor posts 25 and the printed wiring board 101 can be stable for a long period of time. However, the length (L) of each of the conductor posts 25 is not limited to the length described above. For example, as illustrated in FIG. 4B, similar to the printed wiring board (2a) and the printed wiring board (100a) illustrated in FIGS. 2B and 3B, an electronic component (E3) can be mounted on the second conductor pads 22. The electronic component (E3) is connected to the second conductor pads 22, for example, via bonding members 61 composed of solder. The length (L) of each of the conductor posts 25 may be selected according to an electronic component to be connected to the second conductor pads 22, and a thickness of each of the bonding members used for connecting the electronic component.

Next, an example of a method for manufacturing a printed wiring board of the embodiment is described with reference to FIG. 5A-5O using the printed wiring board 2 illustrated in FIG. 2A as an example.

Figure 5A:
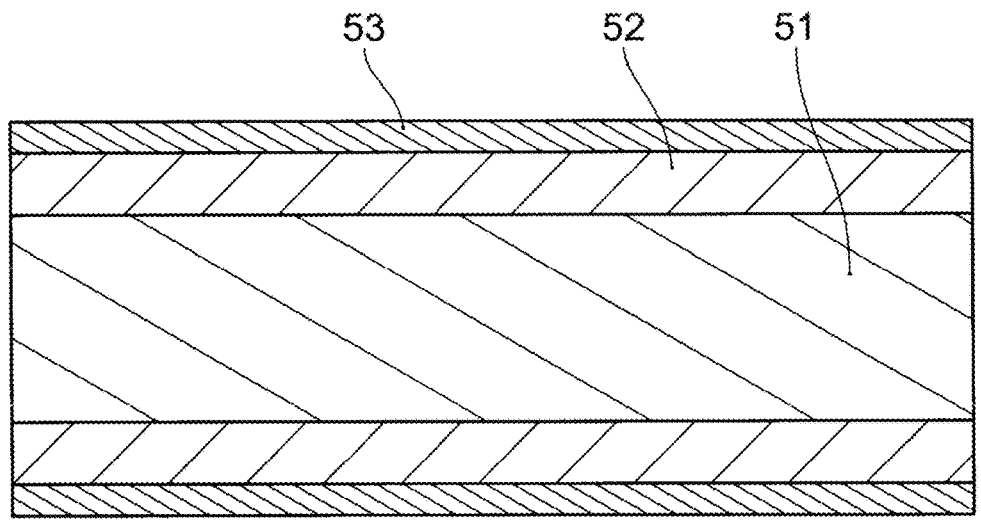
FIG. 5A illustrates a method for manufacturing a printed wiring board according to an embodiment of the present invention.

As illustrated in FIG. 5A, for example, a base plate 51 and a metal film 53 with a carrier copper foil 52 are prepared. The base plate 51 is only conveniently drawn. In FIG. 5A and later-described FIG. 5B-5L, and in FIG. 6A-6K, it is not intended to illustrate an actual thickness of the base plate 51. Further, similar to FIG. 4A, the metal film 53 is also enlarged in a thickness direction thereof. The carrier copper foil 52 and the metal film 53 of the metal film with the carrier copper foil are bonded to each other, for example, by a thermoplastic adhesive (not illustrated in the drawings). The carrier copper foil 52 of the carrier copper foil-attached metal film, for example, is affixed to the base plate 51 composed of a prepreg by thermocompression bonding. By bonding the carrier copper foil 52 and the metal film 53 to each other with a thermoplastic adhesive, the metal film 53 and the carrier copper foil 52 can be easily separated from each other by raising temperature and peeling the metal film 53 and the carrier copper foil 52 away from each other in a later process. The carrier copper foil 52 and the metal film 53 may also be adhered to each other only in a margin portion near an outer periphery. The base plate 51 has an appropriate rigidity. For example, the base plate 51 may be a metal plate such as a copper plate, or may be an insulating plate such as a plate of ceramics. As the metal film 53, for example, a copper foil is used. However, the material of the metal film 53 is not limited to this. The metal film 53 may be formed of a material that allows the first conductor layer (12a) (see FIG. 5D) to be formed on a surface thereof. For example, the metal film 53 may be a film-like or foil-like body composed of another metal such as nickel.

In the method for manufacturing the printed wiring board 2 of the present embodiment, the first conductor layer (12a) and the like can be formed on both sides of the base plate 51. In this case, two sets of the first conductor layer (12a) and the like are simultaneously formed. However, it is also possible that the first conductor layer (12a) and the like are formed on only one side of the base plate 51. In the following description, the manufacturing method of the embodiment is described with respect to one side of the base plate 51, and description and illustration in the drawings with respect to the other side are omitted as appropriate.

Figure 5B:
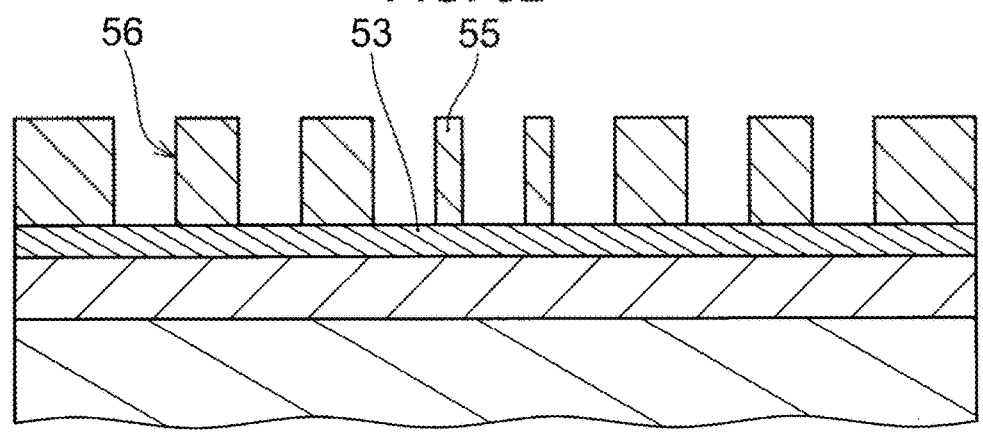
FIG. 5B illustrates a method for manufacturing a printed wiring board according to the embodiment of the present invention.
Figure 5C:
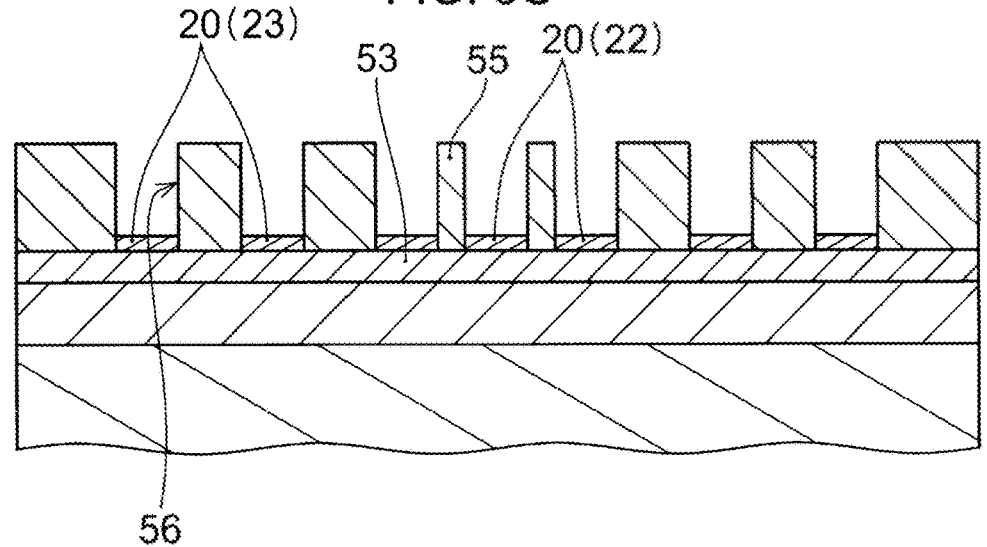
FIG. 5C illustrates a method for manufacturing a printed wiring board according to the embodiment of the present invention.

As illustrated in FIG. 5B, a resist pattern 55 is formed on the metal film 53, the resist pattern 55 having openings 56 at positions where the second and third conductor pads (22, 23) (see FIGS. 2A and 5C) of the first conductor layer (12a) are respectively faulted. The metal film 53 is exposed from bottom surfaces of the openings 56.

Next, plating layers 20 are respectively formed in the openings 56 by electrolytic plating using the metal film 53 as a seed layer. That is, the first conductor layer (12a) including multiple conductor pads and predetermined conductor patterns is formed on the metal film 53 from the plating layers 20. In the case of the printed wiring board 2 illustrated in FIG. 2A, the printed wiring board 2 has the multiple second conductor pads 22 on the center side on the second surface (10T) of the laminate 10 and the multiple third conductor pads 23 on the outer peripheral side. Therefore, the plating layers 20 are respectively formed at the positions corresponding to the conductor pads on the center side and on the outer peripheral side on the metal film 53. In the case where the printed wiring board 1 illustrated in FIG. 1 is manufactured, the plating layers 20 are formed only at the positions corresponding to the second conductor pads 22 on the center side on the second surface (10T) of the laminate 10. Further, when the second and third conductor pads (22, 23) are formed that respectively include corrosion resistant plating layers on surfaces of the second and third conductor pads (22, 23) that are exposed from the second surface (10T), first plating layers composed of gold or the like, for example, are respectively formed as the corrosion resistant plating layers on the bottom surfaces of the openings 56. Next, second plating layers are respectively formed on the first plating layers. The second and third conductor pads (22, 23) are each formed by a laminate that includes a first plating layer and a second plating layer. The corrosion resistant plating layers of the second and third conductor pads (22, 23) facing the metal film 53 are exposed by a removal process of the metal film 53 to be described later (see FIG. 5M).

Figure 5D:
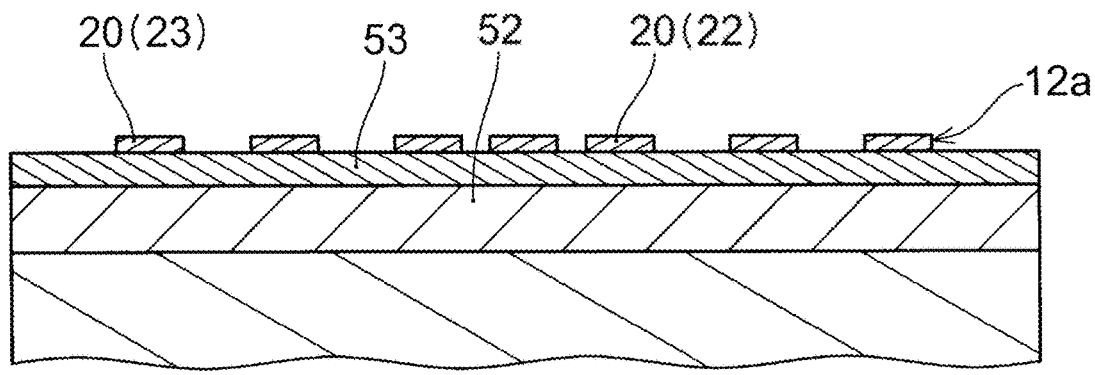
FIG. 5D illustrates a method for manufacturing a printed wiring board according to the embodiment of the present invention.

Next, by removing the resist pattern 55, as illustrated in FIG. 5D, the first conductor layer (12a) is formed in a predetermined pattern including the second and third conductor pads (22, 23) on a surface of the metal film 53 on the opposite side of the carrier copper foil 52.

Figure 5E:
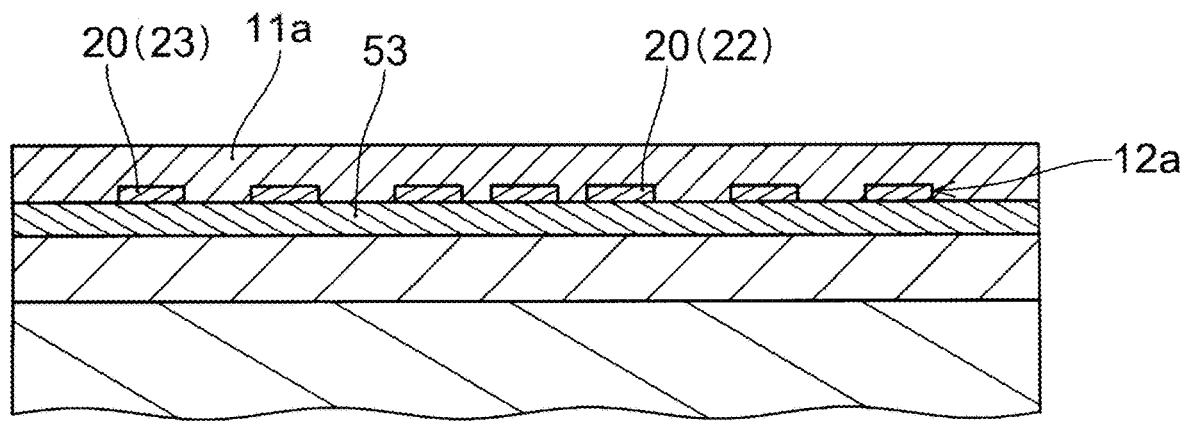
FIG. 5E illustrates a method for manufacturing a printed wiring board according to the embodiment of the present invention.

Next, as illustrated in FIG. 5E, the first resin insulating layer (11a) covering the first conductor layer (12a) is formed on the metal film 53. The first resin insulating layer (11a) foul's the second surface (10T) of the laminate 10 (see FIG. 2A). The first resin insulating layer (11a) is formed so as to cover exposed surfaces of the second and third conductor pads (22, 23) in the first conductor layer (12a). That is, in the example of FIG. 5E, side surfaces and upper surfaces (surfaces of the second and third conductor pads (22, 23) on the opposite side of the metal film 53) of the second and third conductor pads (22, 23) are covered by the first resin insulating layer (11a). For example, a film-like insulating material is laminated on the first conductor layer (12a) and is pressed and heated. As described above, the material of the first resin insulating layer (11a) is an epoxy resin that does not contain a reinforcing material.

Figure 5F:
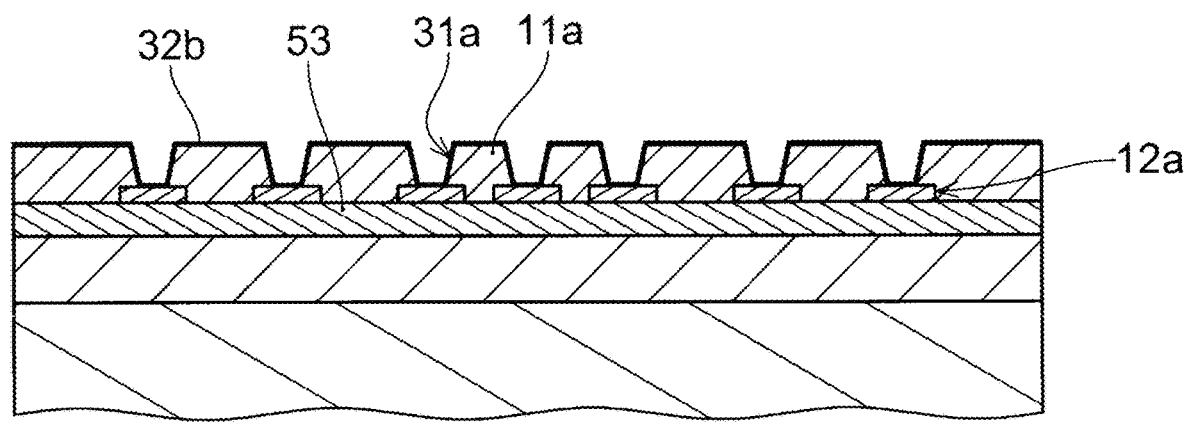
FIG. 5F illustrates a method for manufacturing a printed wiring board according to the embodiment of the present invention.

Next, as illustrated in FIG. 5F, conduction holes (31a) that penetrate the first resin insulating layer (11a) are formed. The conduction holes (31a) are preferably formed by irradiating $CO_2$ laser beams to formation locations of the conduction holes (31a) of the first resin insulating layer (11a). When laser beams are irradiated from a surface of the first resin insulating layer (11a) on the opposite side of the first conductor layer (12a) side, the conduction holes (31a) are formed each having a tapered shape that is gradually reduced in diameter toward the first conductor layer (12a) side.

As illustrated in FIG. 5F, a metal layer (32b) is formed in the conduction holes (31a) and on the surface of the first resin insulating layer (11a), for example, by chemical plating (electroless plating). The metal layer (32b) may also be formed by sputtering, vacuum deposition, or the like. A material of the metal layer (32b) is also preferably copper, but it is not limited to copper. For example, the metal layer (32b) may be a Ti/Cr sputtered layer formed by sputtering. The metal layer (32b) has a thickness of about 0.05 or more and 1.0 μm or less.

Thereafter, as illustrated in FIG. 5G, an electrolytic plating film (33b) is formed, for example, by electrolytic plating using the metal layer (32b) as a seed layer. The second conductor layer (12b) is formed by the metal layer (32b) and the electrolytic plating film (33b) on the first resin insulating layer (11a). Further, the first via conductors (13a) are formed by the metal layer (32b) and the electrolytic plating film (33b) in the conduction holes (31a). Conductor patterns (wiring patterns) of the second conductor layer (12b) can be obtained by forming a plating resist layer (not illustrated in the drawings) having openings at predetermined positions and forming the electrolytic plating film (33b) in the openings. The openings of the plating resist layer are provided at formation positions of the conductor patterns of the second conductor layer (12b) and on the conduction holes (31a). After the formation of the electrolytic plating film (33b), the plating resist layer (not illustrated in the drawings) is removed. The metal layer (32b) exposed by the removal of the plating resist layer is removed by etching. As a result, the second conductor layer (12b) as illustrated in FIG. 5G is formed. Thereafter, the metal layer (32b) and the electrolytic plating film (33b) are not distinguished from each other and are collectively referred to as the second conductor layer (12b). Materials of the metal layer (32b) and the electrolytic plating film (33b) are not particularly limited. Preferably, copper is used. The second conductor layer (12b) can be inexpensively and easily formed.

Next, as illustrated in FIG. 5H, on the second conductor layer (12b) and the first resin insulating layer (11a), by repeating processes similar to the processes of FIG. 5E-5G, the second resin insulating layer (11b) and the third conductor layer (12c) are formed. Similar to the above-described FIG. 5F-5G, the third conductor layer (12c) and the second conductor layer (12b) are connected to each other by forming the second via conductors (13b). As described above, in FIG. 5H, the second conductor layer (12b) and the third conductor layer (12c) are each simplified as one layer in the illustration. Also in FIG. 5I-5M, the conductor layers are similarly simplified in the illustration.

Further, by repeating processes similar to the processes of FIG. 5E-5G, as illustrated in FIG. 5I, on the third conductor layer (12c) and the second resin insulating layer (11b), the third resin insulating layer (11c) and the fourth conductor layer (12d) are formed. The fourth conductor layer (12d) is formed in a predetermined pattern including the first conductor pads 21. The multiple first conductor pads 21 are formed protruding on the first surface (10B). Then, similar to the above-described FIG. 5F-5G, the fourth conductor layer (12d) and the third conductor layer (12c) are connected to each other by forming the third via conductors (13c). The laminate 10 of a four-layer structure of the printed wiring board 2 illustrated in FIG. 2A is completed. By further repeating the processes of FIG. 5E-5G, the laminate 10 can be formed to have a larger desired number of layers. Further, it is also possible that the laminate 10 is formed to have only one resin insulating layer and conductor layers provided on both sides of the resin insulating layer.

Figure 5J:
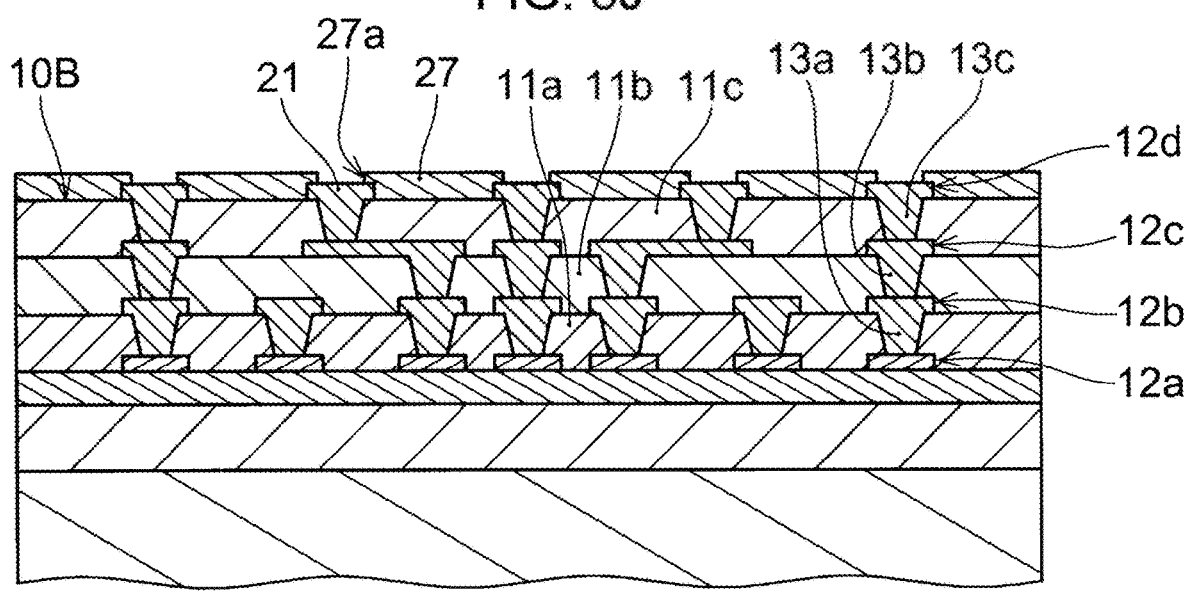
FIG. 5J illustrates a method for manufacturing a printed wiring board according to the embodiment of the present invention.

Next, as illustrated in FIG. 5J, the solder resist layer 27 having the openings (27a) on the first conductor pads 21 is formed on the first surface (10B) (exposed surface of the third resin insulating layer (11c)) of the laminate 10. For example, a layer of a photosensitive epoxy material or the like is formed on the entire surface of the third resin insulating layer (11c) and the fourth conductor layer (12d) of the laminate 10. A portion of the epoxy material layer where the solder resist layer 27 is formed is exposed through a mask. The epoxy material on the first conductor pads 21 or the like is removed by development without being exposed. The removed portions become the openings (27a). The solder resist layer 27 may also be formed using other methods such as screen printing and spray coating. A material of the solder resist layer 27 is not particularly limited. Preferably, an epoxy resin containing 40-70% by weight of inorganic filler such as silica is used.

Figure 5K:
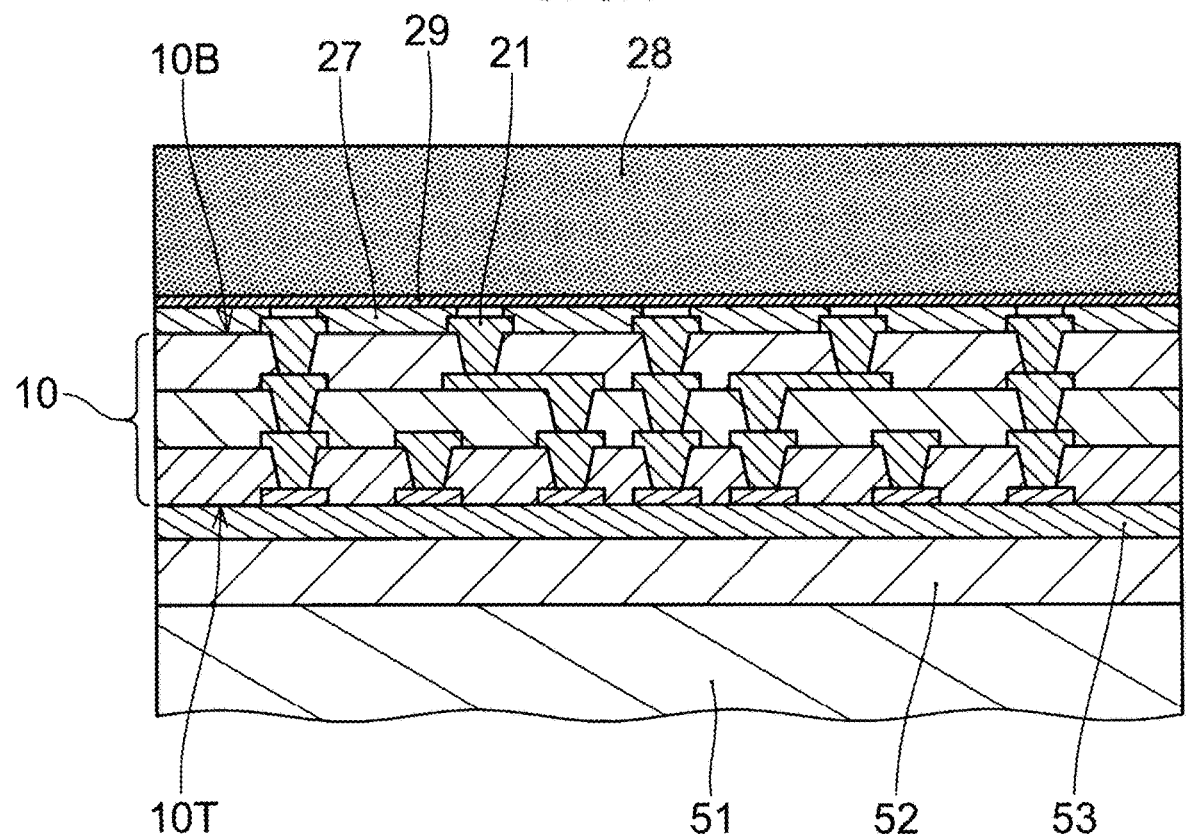
FIG. 5K illustrates a method for manufacturing a printed wiring board according to the embodiment of the present invention.

As illustrated in FIG. 5K, the support plate 28 is adhered to the first surface (10B) of the laminate 10 via the solder resist layer 27. The printed wiring board, after a removal process (to be described later) of the base plate 51 and the carrier copper foil 52, is supported by the support plate 28. For example, the support plate 28 can function as a support member for the laminate 10 during subsequent processes (to be described later) of the printed wiring board 2 and during mounting of an electronic component on the second conductor pads 22 (see FIG. 2A). A material having appropriate rigidity can be used as the support plate 28. For example, as the support plate 28, a glass epoxy substrate obtained by curing a prepreg, or a metal plate similar to the base plate 51 (see FIG. 5A), or a double-sided copper-clad laminated plate or the like, can be used. The support plate 28 has a thickness of, for example, 100 μm or more and 500 μm or less. The support plate 28 has adhesion to the solder resist layer 27, and is adhered to the solder resist layer 27 via the adhesive layer 29 that functions as an adhesive for adhering the support plate 28 to the solder resist layer 27. A material that forms the adhesive layer 29 is not particularly limited as long as the material can adhere to the support plate 28. The support plate 28 may be removed from the laminate 10, for example, after the above-described mounting of an electronic component. Therefore, as the material of the adhesive 29, in particular, a material is preferred that has moderate adhesion, but does not develop a strong adhesive force, with respect to a bonding surface of the laminate 10, that is, with respect to the solder resist layer 27 and the first conductor pads 21. A material is preferred that at least develops a strong adhesive force with respect to the support plate 28 other than with respect to the solder resist layer 27 and the like. It is also possible that the material that forms the adhesive layer 29 is a material that loses adhesion with respect to the solder resist layer 27 due to a specific treatment such as ultraviolet irradiation or heating. For example, an acrylic resin can be used as the material of the adhesive layer 29.

Figure 5L:
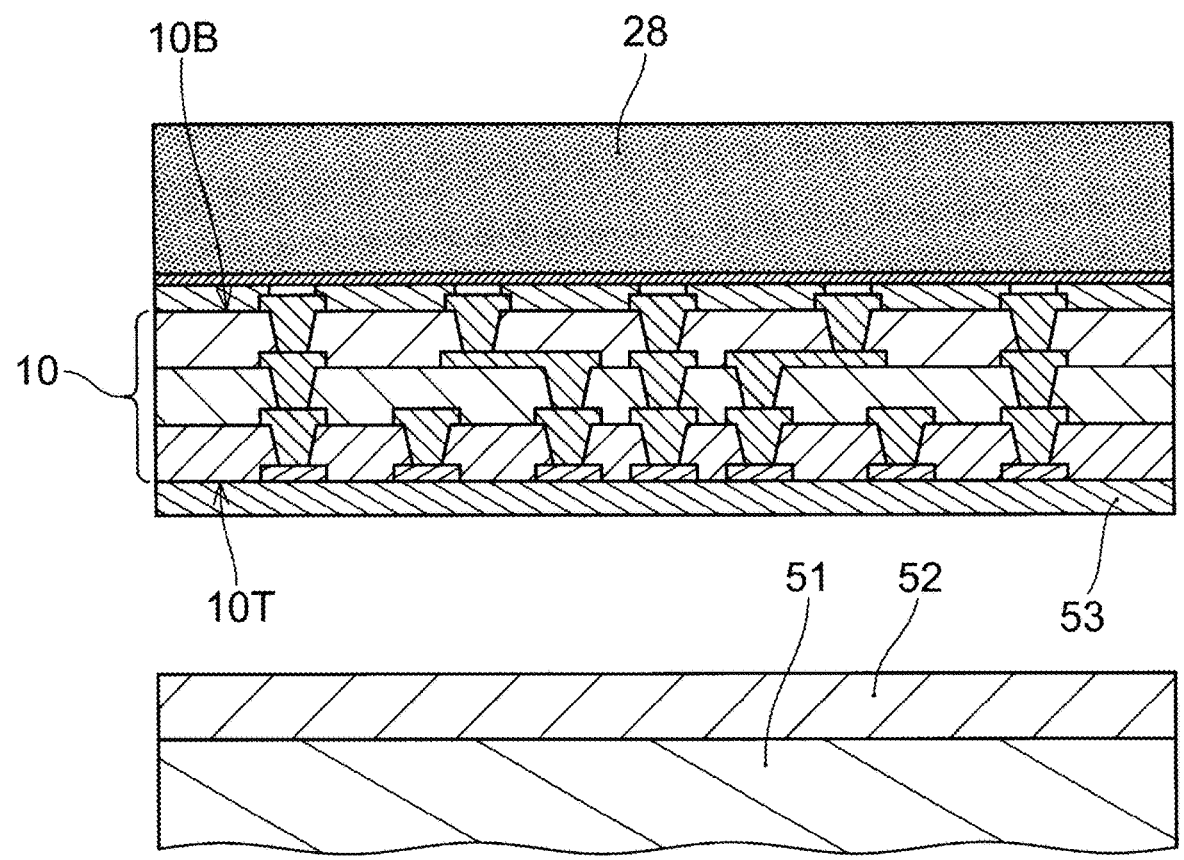
FIG. 5L illustrates a method for manufacturing a printed wiring board according to the embodiment of the present invention.

Next, as illustrated in FIG. 5L, the base plate 51 and the carrier copper foil 52 are removed. In the case where the conductor layers and the like are formed on both sides of the base plate 51, by removing the base plate 51 and the carrier copper foil 52, two laminate 10 are obtained. As described above, the carrier copper foil 52 and the metal film 53 are bonded to each other by a thermoplastic resin or the like. Therefore, for example, by raising temperature and applying a force, the base plate 51 and the carrier copper foil 52 can be easily separated from the metal film 53. As a result, a bonding surface of the metal film 53 to the carrier copper foil 52 is exposed. When the carrier copper foil 52 and the metal film 53 are adhered to each other only in a peripheral margin portion, the two can be easily separated by cutting an inner side of the bonded portion. The metal film 53 is exposed on the entire surface on the second surface (10T) side of the laminate 10.

Figure 5M:
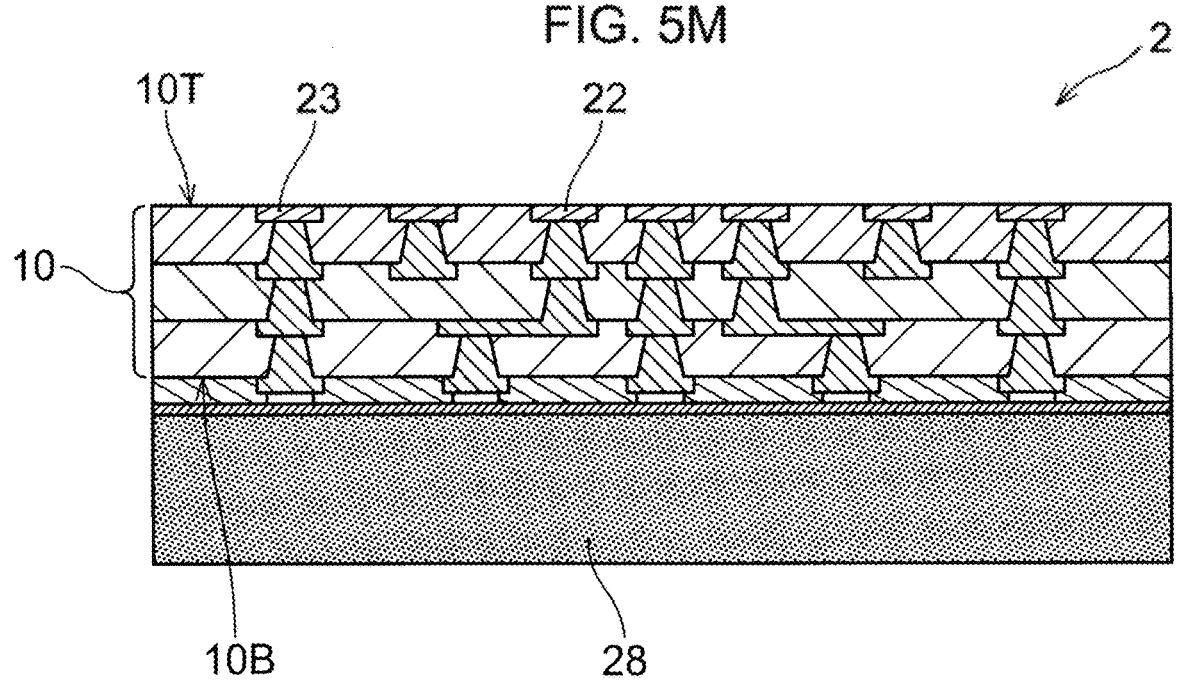
FIG. 5M illustrates a method for manufacturing a printed wiring board according to the embodiment of the present invention.

Next, as illustrated in FIG. 5M, the metal film 53 is removed by etching. By the removal of the metal film 53, the surfaces of the second and third conductor pads (22, 23) on the opposite side of the support plate 28 are exposed. That is, the surfaces of the second and third conductor pads (22, 23) on the opposite side of the first surface (10B) of the laminate 10 are exposed. The printed wiring board 2 illustrated in FIG. 2A is completed. The electronic component (E1) (see FIG. 2B) may be connected to the second conductor pads 22 of the completed printed wiring board 2. In the printed wiring board 2 of the embodiment, the multiple second conductor pads 22 including pads for connecting to an electronic component are formed at a fine pitch on the second surface (10T) of the laminate 10. The second surface (10T) can be a preferred mounting surface for connecting an electronic component such as a semiconductor element in which a large number of electrodes are provided at a fine pitch.

Figure 5N:
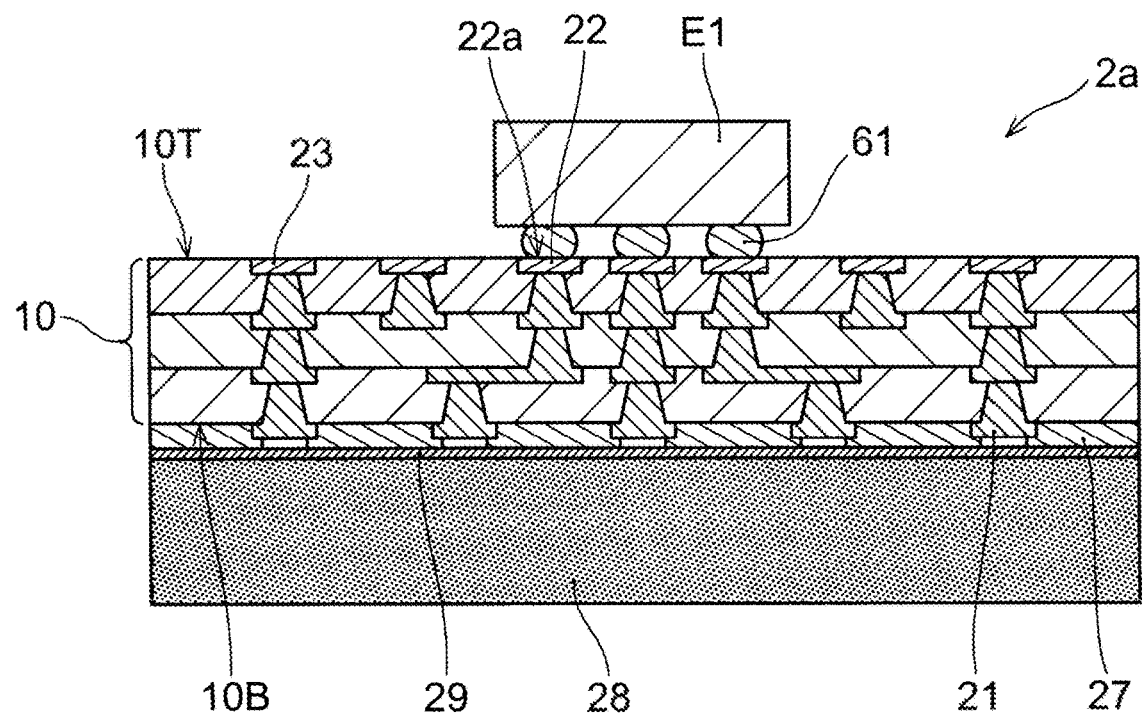
FIG. 5N illustrates an example of mounting an electronic component in a method for manufacturing a printed wiring board according to the embodiment of the present invention.

In the case where the printed wiring board (2a) having an electronic component illustrated in FIG. 2B is manufactured, the electronic component (E1) is mounted on the printed wiring board 2 illustrated in FIG. 5M. As illustrated in FIG. 5N, the electronic component (E1) is positioned on the second surface (10T) of the laminate 10 such that the terminals of the electronic component (E1) are respectively positioned on the surfaces (22a) of the second conductor pads 22 via the bonding members 61. Prior to the positioning of the electronic component (E1), a solder paste or the like may be supplied onto the second conductor pads 22. Together with the electronic component (E1), the printed wiring board 2 is heated in a reflow furnace or a high temperature tank or the like, and the electronic component (E1) is connected to the second conductor pads 22. Since the electronic component (E1) is mounted in a state in which the laminate 10 is supported by the support plate 28, the electronic component (E1) can be properly mounted on the printed wiring board 2. The printed wiring board having the electronic component (E1) illustrated in FIG. 2B is completed.

Figure 5O:
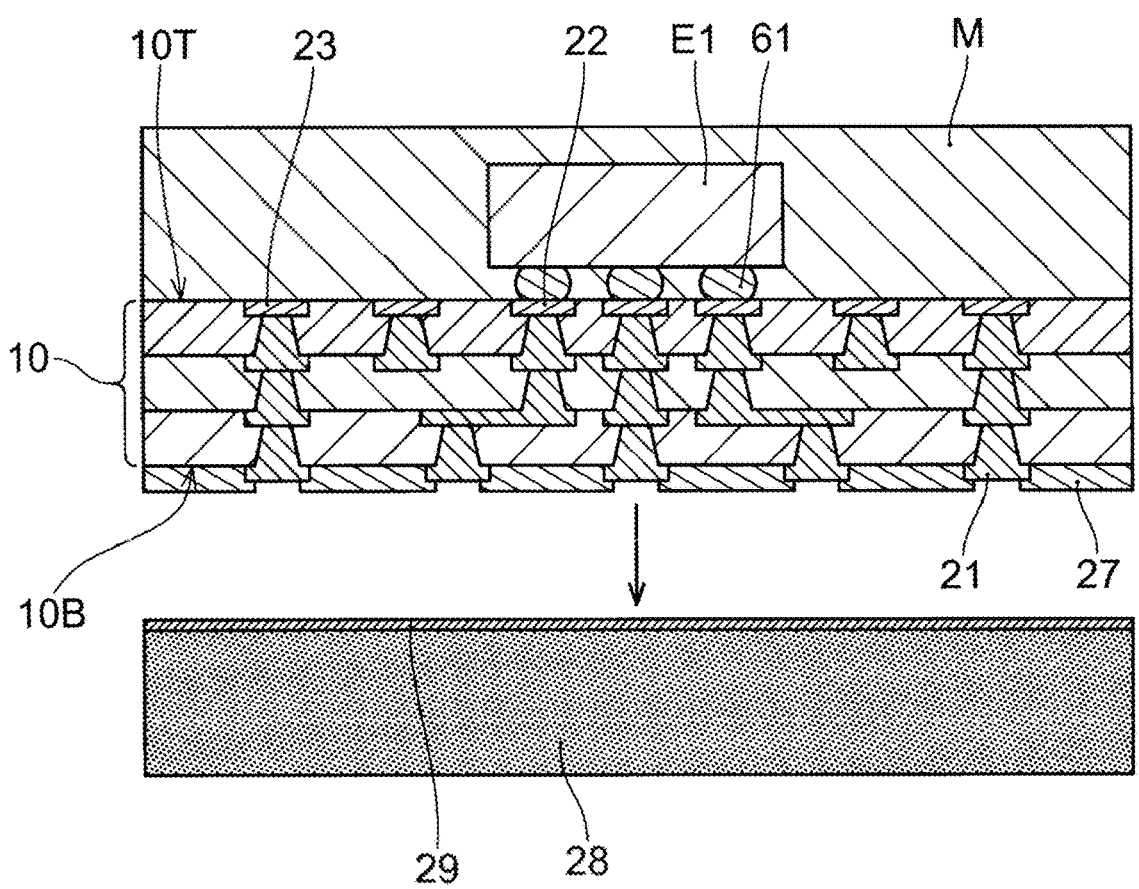
FIG. 5O illustrates an example of removing a support plate in a method for manufacturing a printed wiring board according to the embodiment of the present invention.

After the electronic component (E1) is mounted, as illustrated in FIG. 5O, the support plate 28 may be peeled off from the laminate 10. As a result, the first conductor pads 21 are exposed, and connection between an external electrical circuit and the first conductor pads 21 is facilitated. Further, as illustrated in FIG. 5O, a resin sealing layer (M) covering around the electronic component (E1) may be formed. In the case where the resin sealing layer (M) is formed, the support plate 28 may be peeled off before the formation of the resin sealing layer (M), or may be peeled off after the formation of the resin sealing layer (M).

As described above, the adhesive layer 29 that closely adheres the support plate 28 and the laminate 10 to each other is preferably formed of a material that does not have strong adhesion with respect to the solder resist layer 27. In this case, the support plate 28 and the laminate 10 can be easily separated from each other by pulling the two in mutually opposite directions. Depending on adhesive properties of the adhesive layer 29, the support plate 28 and the laminate 10 may be pulled apart from each other while ultraviolet irradiation or heating is performed, or after ultraviolet irradiation or heating is performed. After the electronic component (E1) is mounted, the support plate 28 can be removed, for example, at an appropriate timing up to a process of connecting the first conductor pads 21 and an external electrical circuit.

The resin sealing layer (M) can be formed, for example, by supplying a flowable mold resin mainly composed of an epoxy resin or the like to an upper surface and surrounding areas of the electronic component (E1) and applying heat when necessary. The resin sealing layer (M) may be formed using any other method such as laminating and heating a resin film on the electronic component (E1). Further, it is also possible that a so-called underfill-like resin sealing layer, which fills only a gap between the electronic component (E1) and the laminate 10, is formed.

In the printed wiring board 2 illustrated in FIG. 2A, the exposed surface sides of the second and third conductor pads (22, 23) on the opposite side of the support plate 28, which are exposed due to the removal of the metal film 53, are formed in a state flush with the second surface (10T) (the exposed surface of the first resin insulating layer (11a)) of the laminate 10. However, it is also possible that the exposed surfaces of the second and third conductor pads (22, 23) on the opposite side of the support plate 28 are recessed from the second surface (10T) of the laminate 10. That is, during the etching of the metal film 53, even when the metal film 53 is substantially removed and the second surface (10T) of the laminate 10 below the metal film 53 is exposed, the etching process may be continued. When portions near the exposed surface of the second and third conductor pads (22, 23) are formed a material that can be dissolved by an etching solution of the metal film 53, the exposed surfaces of the second and third conductor pads (22, 23) can be etched and recessed relative to the second surface (10T). When the electronic component (E1) or the like is connected, portions of the first resin insulating layer (11a) between the conductor pads become walls, and wet spreading of the bonding members 61 (see FIG. 2B) composed of solder or the like from the conductor pads can be prevented. An electrical short circuit state due to contact between bonding members 61 of adjacent conductor pads can be prevented. Further, such continuation of etching is also preferable from a point of view that the metal film 53 is completely removed and the conductor pads are reliably separated from each other. After the removal of the metal film 53, how far the exposed surfaces of the second and third conductor pads (22, 23) are etched is arbitrary. For example, the exposed surfaces of the second and third conductor pads (22, 23) can be recessed by a few μm from the second surface (10T).

Further, in the example of FIG. 2A, the second surface (10T) of the laminate 10 is exposed without being covered by a solder resist. However, it is also possible that a solder resist layer is formed on the second surface (10T) of the laminate 10 using the same method as the formation method of the solder resist layer 27. Further, it is also possible that a protective film composed of Ni/Au, Ni/Pd/Au, Sn or the like is formed on the exposed surface of each of the second and third conductor pads (22, 23).

Next, an embodiment of a method for manufacturing the printed wiring board 100 illustrated in FIG. 3A is described with reference to FIG. 6A-6L.

Figure 6A:
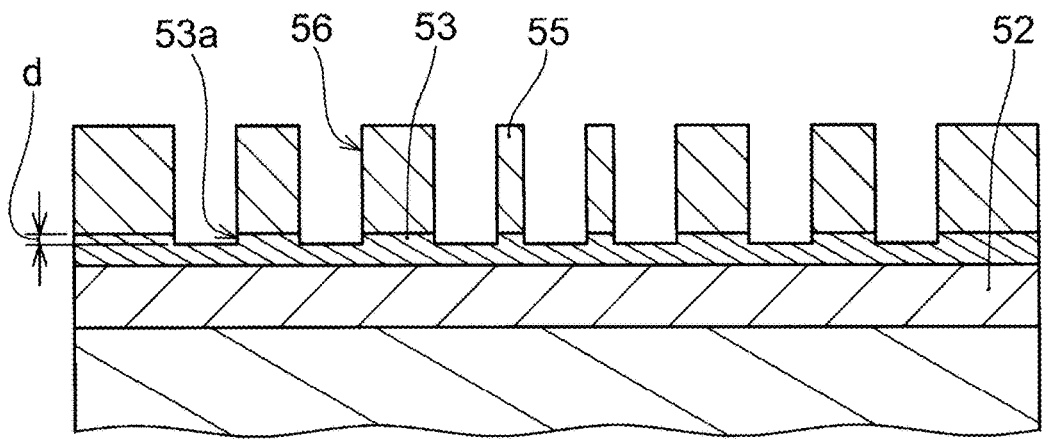
FIG. 6A illustrates a method for manufacturing a printed wiring board according to another embodiment of the present invention.

On the base plate 51 and the metal film 53 with the carrier copper foil 52 that are prepared in the same way as in the process of FIG. 5A, a resist pattern 55 is formed on the metal film 53 in the same way as in the process of FIG. 5B, the resist pattern 55 having openings 56 at positions where the second conductor pads 22 and the third conductor pads 23 of the first conductor layer (12a) are respectively formed. The metal film 53 is exposed in the openings 56. Next, as illustrated in FIG. 6A, the metal film 53 exposed by the openings 56 is etched. Multiple recesses (53a) are formed in the metal film 53.

The recesses (53a) each have a depth (d). The depth (d) is a length from an interface between the metal film 53 and the resist pattern 55 to a bottom surface of each of the recesses (53a). The depth (d) of the recesses (53a) is, for example, 2 μm or more and 10 μm or less. The depth (d) of the recesses (53a) substantially corresponds to the height (h) (see FIGS. 3A and 4A) of the protruding portion of the dissimilar metal layer 24 relative to the second surface (10T). Therefore, by varying the depth (d) of the recesses (53a), that is, an etching amount of the metal film 53 in the present process, the height (h) of the protruding portion of the dissimilar metal layer 24, that is, the protruding portion of each of the second conductor pads 22 and the third conductor pads 23, relative to the second surface (10T) can be easily adjusted. The height (h) of the protrusion of each of the second conductor pads 22 and the third conductor pads 23 relative to the second surface (10T) can be arbitrarily selected according to a thickness or the like of an electronic component to be mounted on the second conductor pads 22. As illustrated in FIG. 6A, the depth (d) of the recesses (53a) is smaller than a thickness of the metal film 53. That is, the recesses (53a) do not penetrate the metal film 53. Further, the recesses (53a) are formed to have substantially the same planar shapes as the second conductor pads 22 and the third conductor pads 23.

Figure 6B:
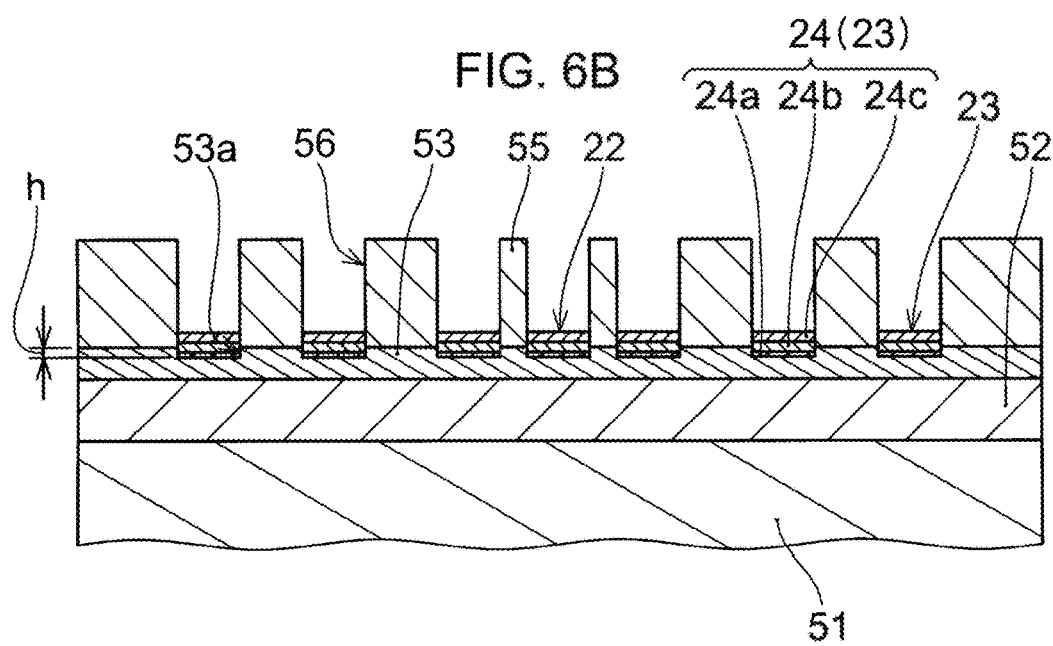
FIG. 6B illustrates a method for manufacturing a printed wiring board according to the embodiment of the present invention.

Next, as illustrated in FIG. 6B, a plating layer is formed in each of the recesses (53a) by electrolytic plating using the metal film 53 as a seed layer. By laminating multiple metal layers composed of dissimilar metals, the dissimilar metal layer 24 is formed in each of the recesses (53a). That is, the second conductor pads 22 and the third conductor pads 23 are formed. In the printed wiring boards (100, 101) of FIGS. 3A and 4A, the dissimilar metal layers 24 that respectively form the second conductor pads 22 and the third conductor pads 23 are each formed by three metal layers. As illustrated in FIG. 6B, the base plate 51 side portions of the dissimilar metal layers 24 are respectively formed in the recesses (53a). The first metal layer (24a) is formed on the bottom surface of each of the recesses (53a); the second metal layer (24b) is formed on the first metal layer (24a); and the third metal layer (24c) is formed on the second metal layer (24b). The first metal layer (24a) is preferably a corrosion resistant plating layer formed of a highly corrosion resistant metal. The first metal layer (24a), the second metal layer (24b) and the third metal layer (24c) are respectively formed, for example, by gold, nickel and copper plating layers. However, the materials of the metal layers are not limited to these. It is possible that, on the first metal layer (24a), at least one metal layer composed of a metal different from that of the first metal layer is formed. Further, FIG. 6B illustrates an example in which the first metal layer (24a) is formed thinner than other metal layers. However, it is also possible that the metal layers are formed to have the same thickness.

As illustrated in FIG. 6B, the dissimilar metal layer 24 has a thickness larger than the depth (d) of the recesses (53a). The openings 56 are also respectively partially filled by the dissimilar metal layers 24. After the formation of the dissimilar metal layers 24, the resist pattern 55 is removed.

Figure 6C:
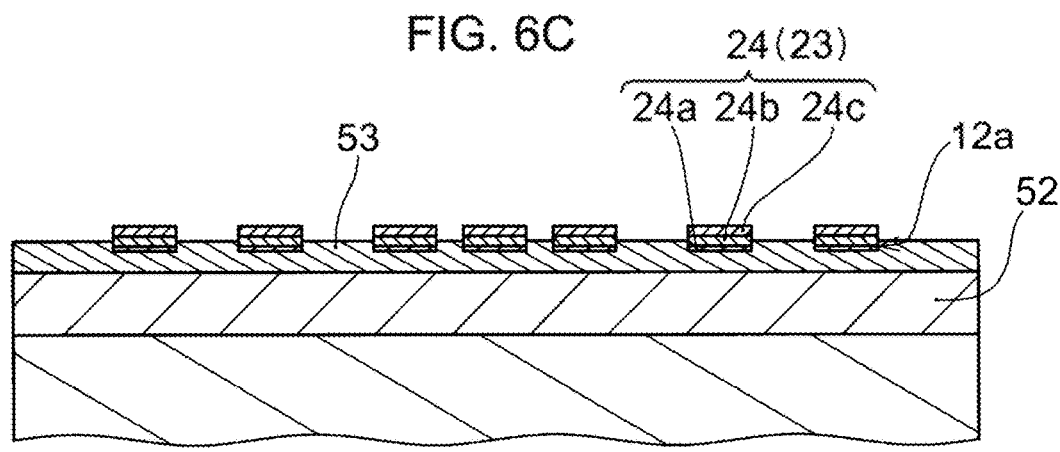
FIG. 6C illustrates a method for manufacturing a printed wiring board according to the embodiment of the present invention.

As illustrated in FIG. 6C, the first conductor layer (12a) in a predetermined pattern including the dissimilar metal layers 24 is formed. A portion of each of the dissimilar metal layers 24 protrudes from a surface of the metal film 53 on the opposite side of the carrier copper foil 52. The third metal layer (24c) forms an end portion of the protruding portion of each of the dissimilar metal layers 24 that protrudes from the metal film 53.

Figure 6D:
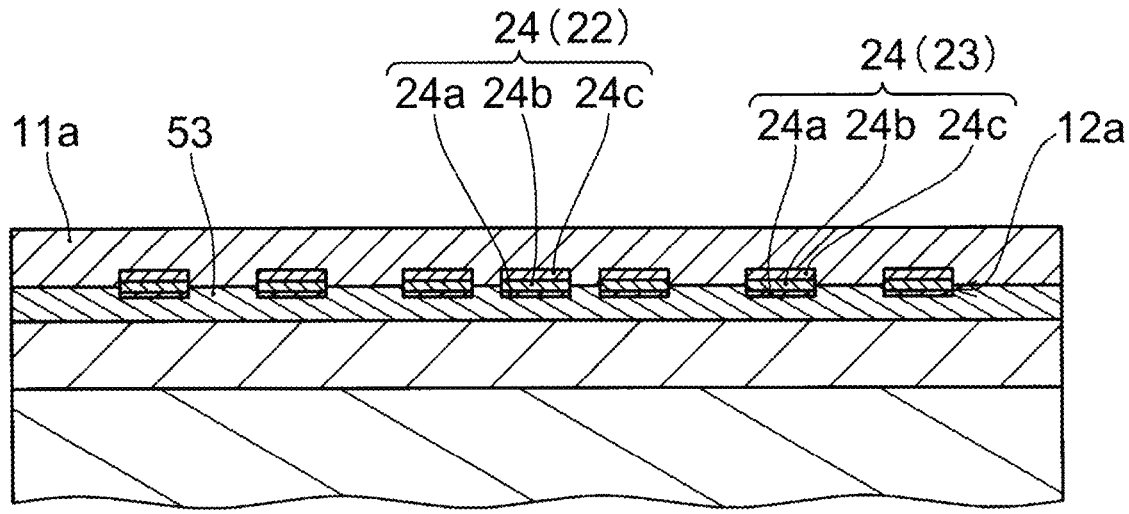
FIG. 6D illustrates a method for manufacturing a printed wiring board according to the embodiment of the present invention.

Next, as illustrated in FIG. 6D, the first resin insulating layer (11a) covering the first conductor layer (12a) is formed on the metal film 53 and on the first conductor layer (12a) using the same method as that in the process of FIG. 5E. The first resin insulating layer (11a) is formed so as to cover exposed surfaces of the second and third conductor pads (22, 23) including portions of side surfaces of the second and third conductor pads (22, 23). That is, the first resin insulating layer (11a) is formed such that the protruding portions of the second conductor pads 22 and the third conductor pads 23 that protrude from the metal film 53 are embedded in the first resin insulating layer (11a).

Figure 6E:
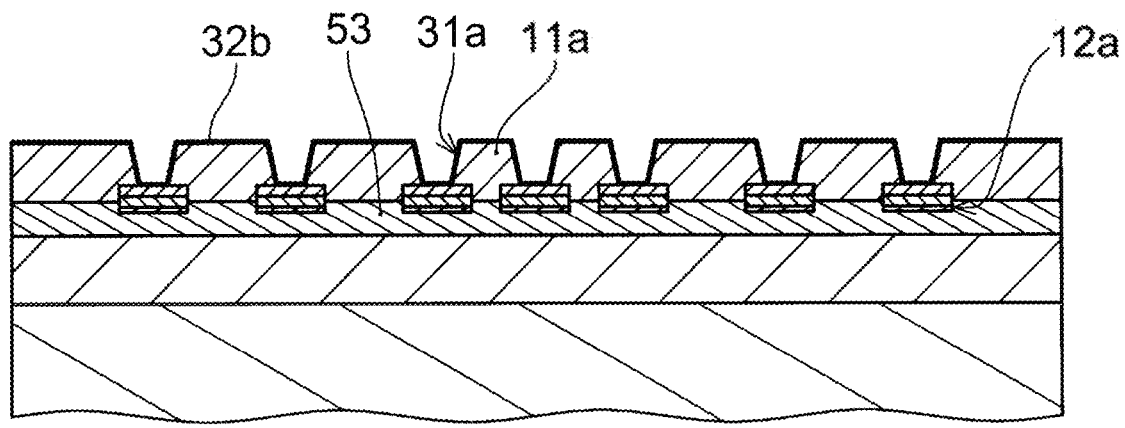
FIG. 6E illustrates a method for manufacturing a printed wiring board according to the embodiment of the present invention.
Figure 6F:
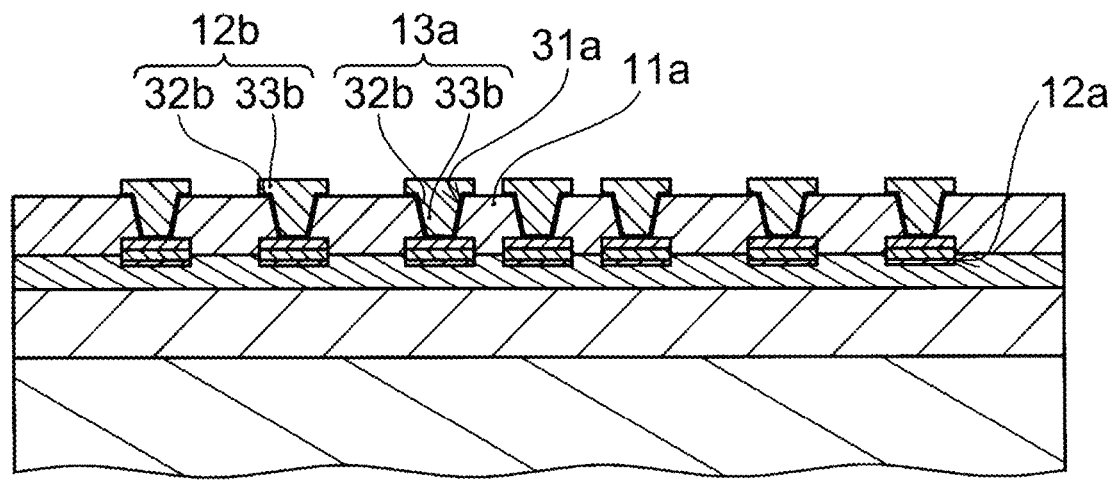
FIG. 6F illustrates a method for manufacturing a printed wiring board according to the embodiment of the present invention.
Figure 6G:
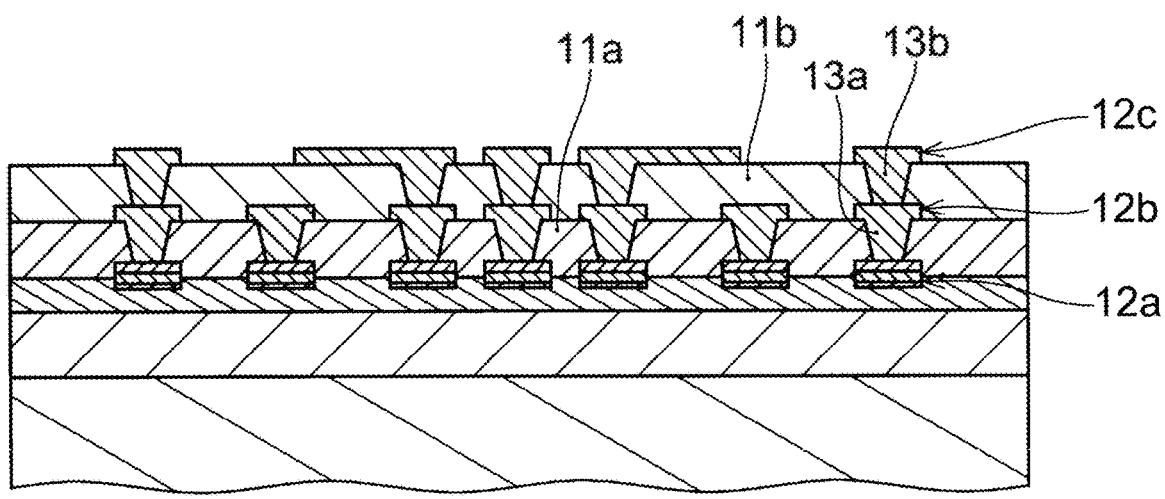
FIG. 6G illustrates a method for manufacturing a printed wiring board according to the embodiment of the present invention.
Figure 6H:
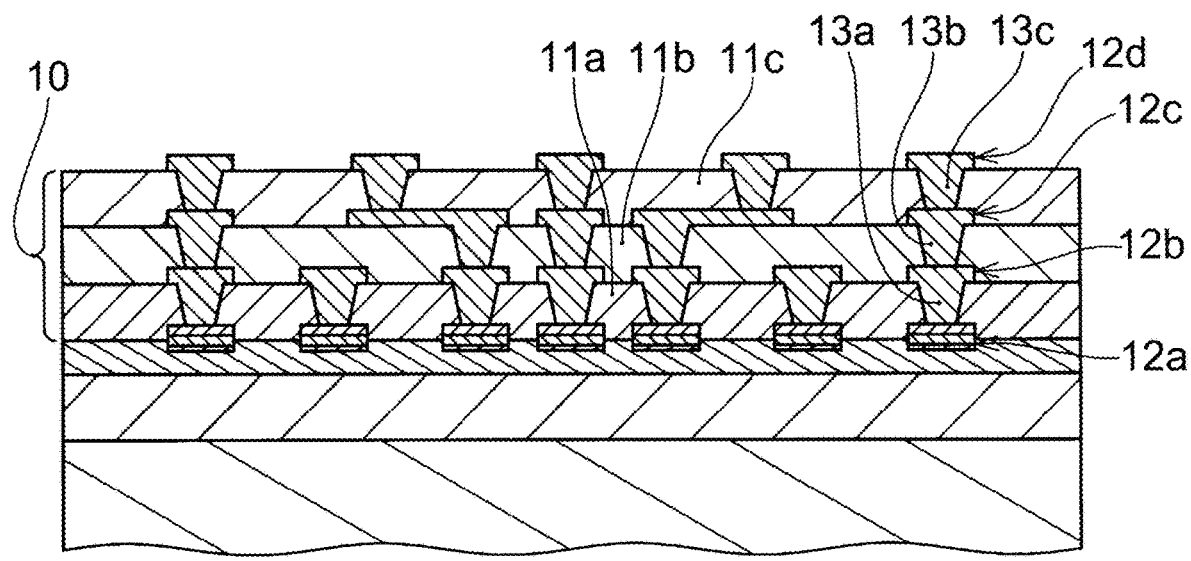
FIG. 6H illustrates a method for manufacturing a printed wiring board according to the embodiment of the present invention.

As illustrated in FIG. 6E, the conduction holes (31a) that penetrate the first resin insulating layer (11a) and each have a tapered shape that is gradually reduced in diameter toward the first conductor layer (12a) side are formed in the first resin insulating layer (11a) using the same method as that in the process of FIG. 5F. Subsequently, as illustrated in FIG. 6F, using the same method as that in the processes of FIGS. 5F and 5G, the metal layer (32b) is formed in the conduction holes (31a) and on the surface of the first resin insulating layer (11a). The electrolytic plating film (33b) is formed by electrolytic plating using the metal layer (32b) as a seed layer. The metal layer (32b) and the electrolytic plating film (33b) on the first resin insulating layer (11a) form the second conductor layer (12b), and the first via conductors (13a) are formed by the metal layer (32b) and the electrolytic plating film (33b) in the conduction holes (31a). Then, as illustrated in FIG. 6G, by repeating the same processes as those of FIG. 5E-5G, the third conductor layer (12c) and the second resin insulating layer (11b) are formed on the second conductor layer (12b) and the first resin insulating layer (11a). Similarly, as illustrated in FIG. 6H, the fourth conductor layer (12d) and the third resin insulating layer (11c) are formed on the third conductor layer (12c) and the second resin insulating layer (11b). The fourth conductor layer (12d) is formed in a predetermined pattern including the first conductor pads 21 that are formed protruding on the first surface (10B). The second via conductors (13b) are formed in the second resin insulating layer (11b); and the third via conductors (13c) are formed in the third resin insulating layer (11c). In FIG. 6G-6L, the conductor layers are each simplified as one layer.

Figure 6I:
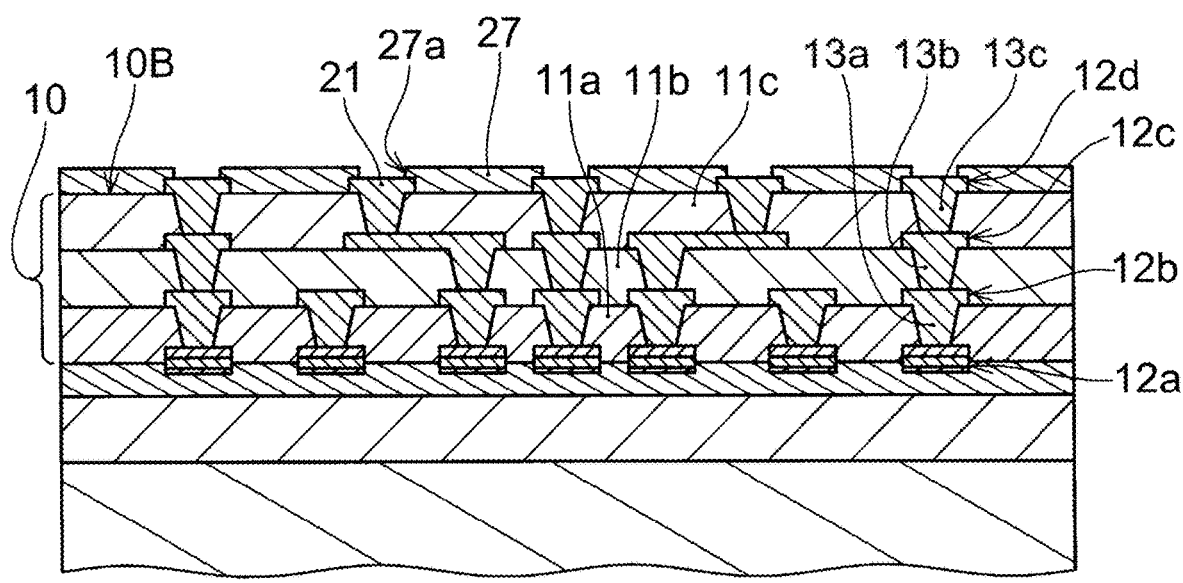
FIG. 6I illustrates a method for manufacturing a printed wiring board according to the embodiment of the present invention.
Figure 6J:
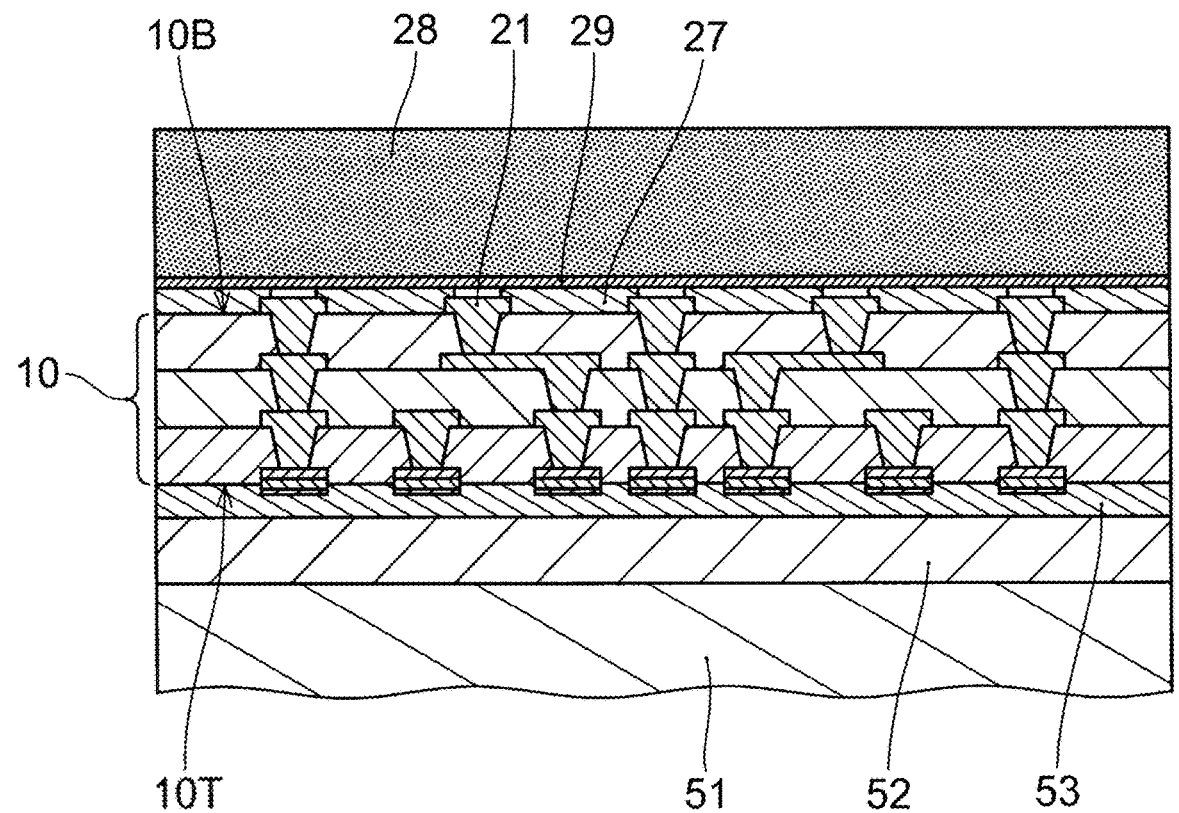
FIG. 6J illustrates a method for manufacturing a printed wiring board according to the embodiment of the present invention.
Figure 6K:
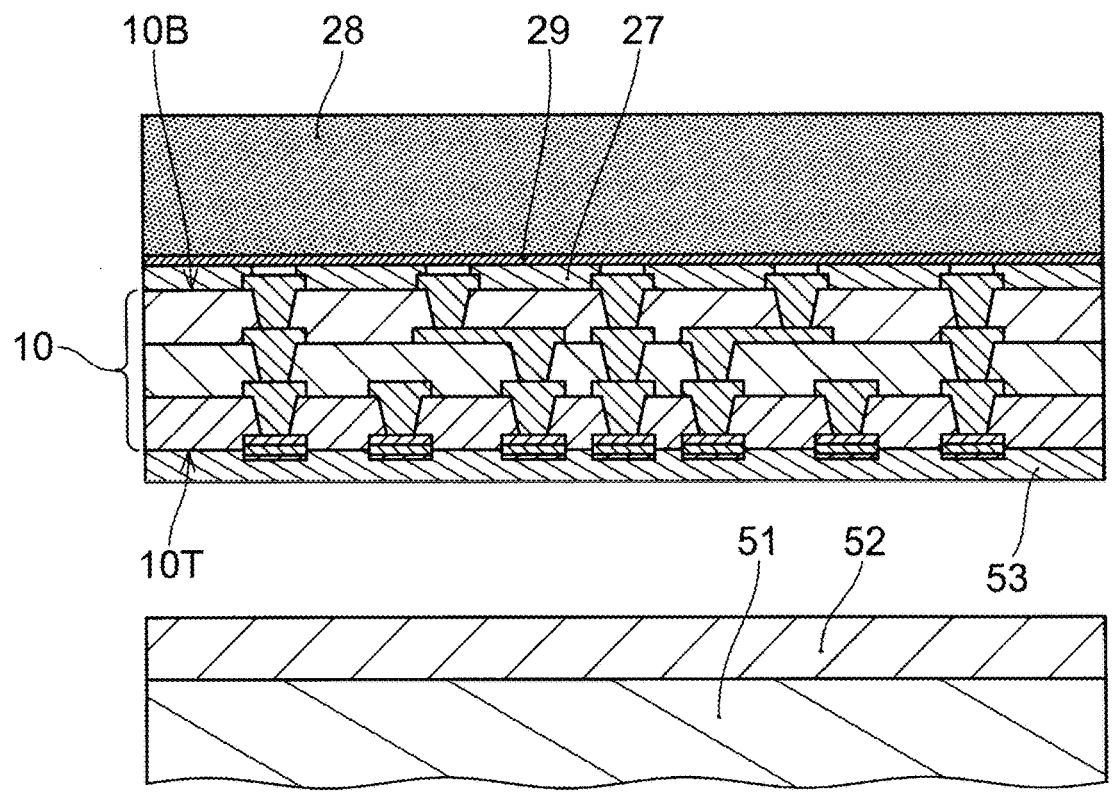
FIG. 6K illustrates a method for manufacturing a printed wiring board according to the embodiment of the present invention.

Next, as illustrated in FIG. 6I, using the same method as that in the process of FIG. 5J, the solder resist layer 27 having the openings (27a) on the first conductor pads 21 is formed. Then, as illustrated in FIG. 6J, using the same method as that in the process of FIG. 5K, the support plate 28 is adhered to the first surface (10B) of the laminate 10 via the solder resist layer 27. Subsequently, as illustrated in FIG. 6K, using the same method as that in the process of FIG. 5L, the base plate 51 and the carrier copper foil 52 are removed, and the metal film 53 is exposed on the entire surface on the second surface (10T) side of the laminate 10.

Figure 6L:
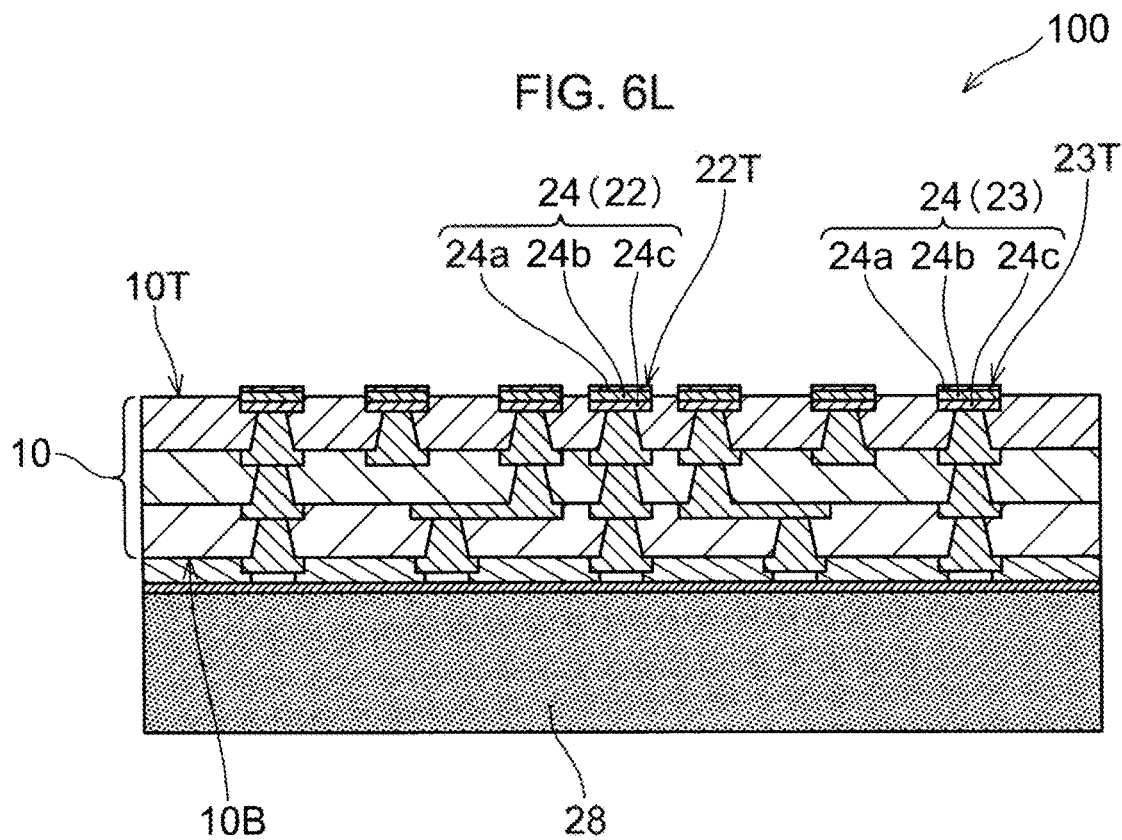
FIG. 6L illustrates a method for manufacturing a printed wiring board according to the embodiment of the present invention.

As illustrated in FIG. 6L, the metal film 53 is removed by etching. By the removal of the metal film 53, end surfaces (22T, 23T) of the dissimilar metal layers 24, which respectively form the second and third conductor pads (22, 23), on the opposite side of the first surface (10B) are exposed. The printed wiring board 100 illustrated in FIG. 3A is completed. Portions of the dissimilar metal layers 24 including the end surfaces (22T, 23T) protrude from the second surface (10T) of the laminate 10. The second and third conductor pads (22, 23) including the portions protruding from the second surface (10T) of the laminate 10 are formed. Mounting of an electronic component on the second surface (10T) is facilitated. The end surfaces (22T, 23T) of the second and third conductor pads (22, 23) are respectively formed by the first metal layers (24a). That is, for example, a corrosion resistant plating layer composed of highly corrosion resistant gold forms each of the end surfaces (22T, 23T) of the second and third conductor pads (22, 23). For example, good soldering between an external electronic component or a wiring board or the like and the second and third conductor pads (22, 23) can be obtained.

In the case where the printed wiring board (100a) illustrated in FIG. 3B is manufactured, the electronic component (E2) is connected to the second conductor pads 22 of the printed wiring board 100 illustrated in FIG. 6L via the bonding members 61. The electronic component (E2) can be connected to the second conductor pads 22 through the same process as the process described with reference to FIG. 5N. The support plate 28 may be peeled off from the laminate 10 of the printed wiring board (100a) using the same method as that described with reference to FIG. 5O. Further, a resin sealing layer (M) covering around the electronic component (E2) may be formed. In the case where the resin sealing layer (M) is formed, the support plate 28 may be peeled off before the formation of the resin sealing layer (M), or may be peeled off after the formation of the resin sealing layer (M).

Figure 7A:
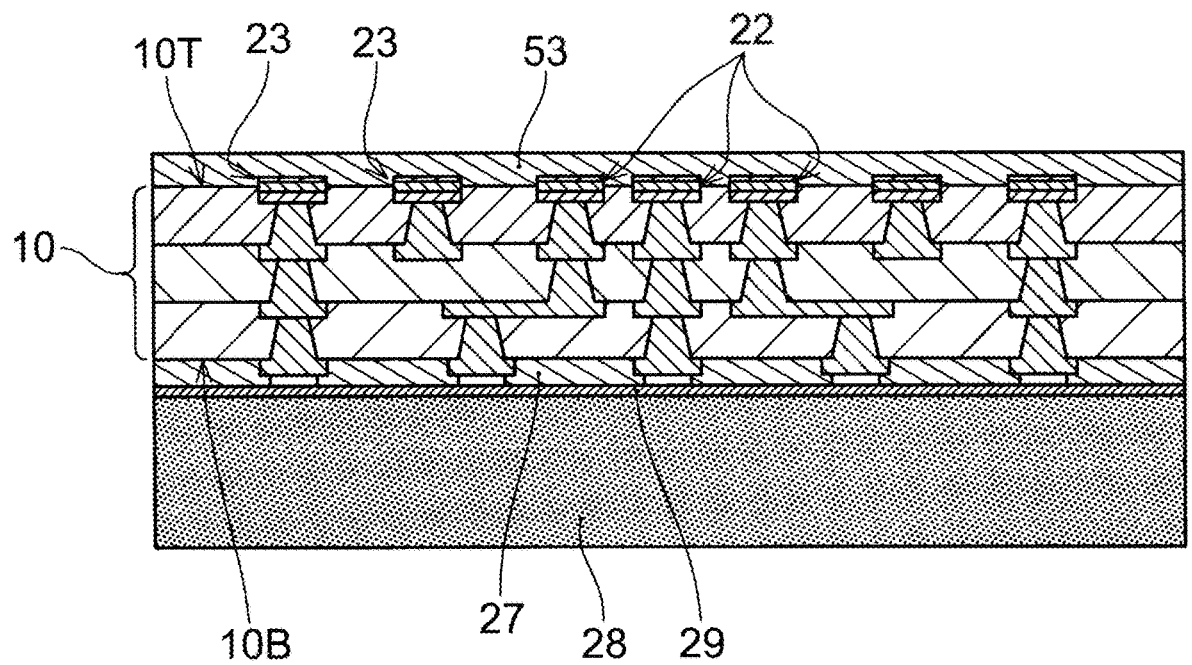
FIG. 7A illustrates a method for manufacturing a printed wiring board according to yet another embodiment of the present invention.
Figure 7B:
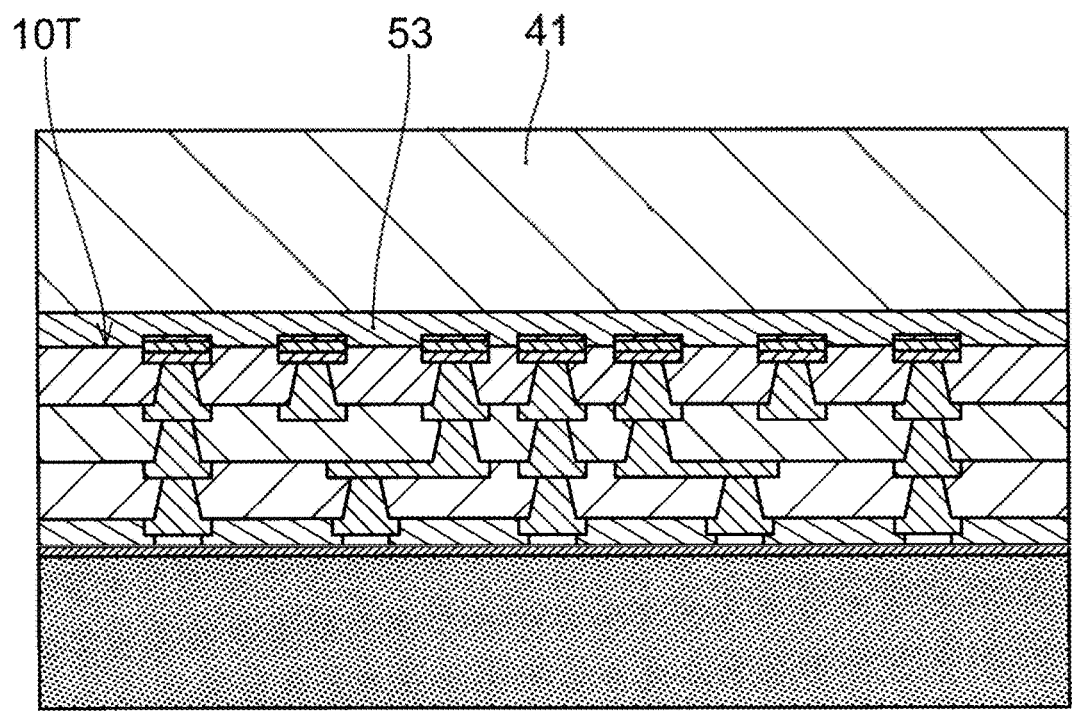
FIG. 7B a method for manufacturing a printed wiring board according to the embodiment of the present invention.
Figure 7C:
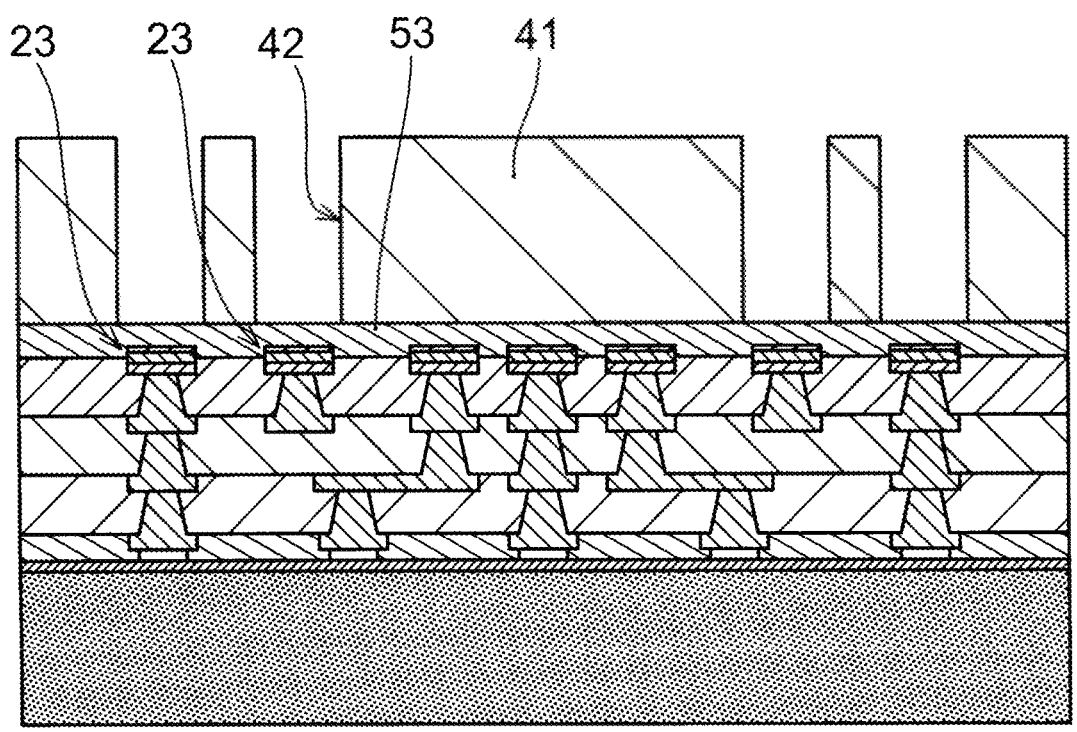
FIG. 7C illustrates a method for manufacturing a printed wiring board according to the embodiment of the present invention.
Figure 7D:
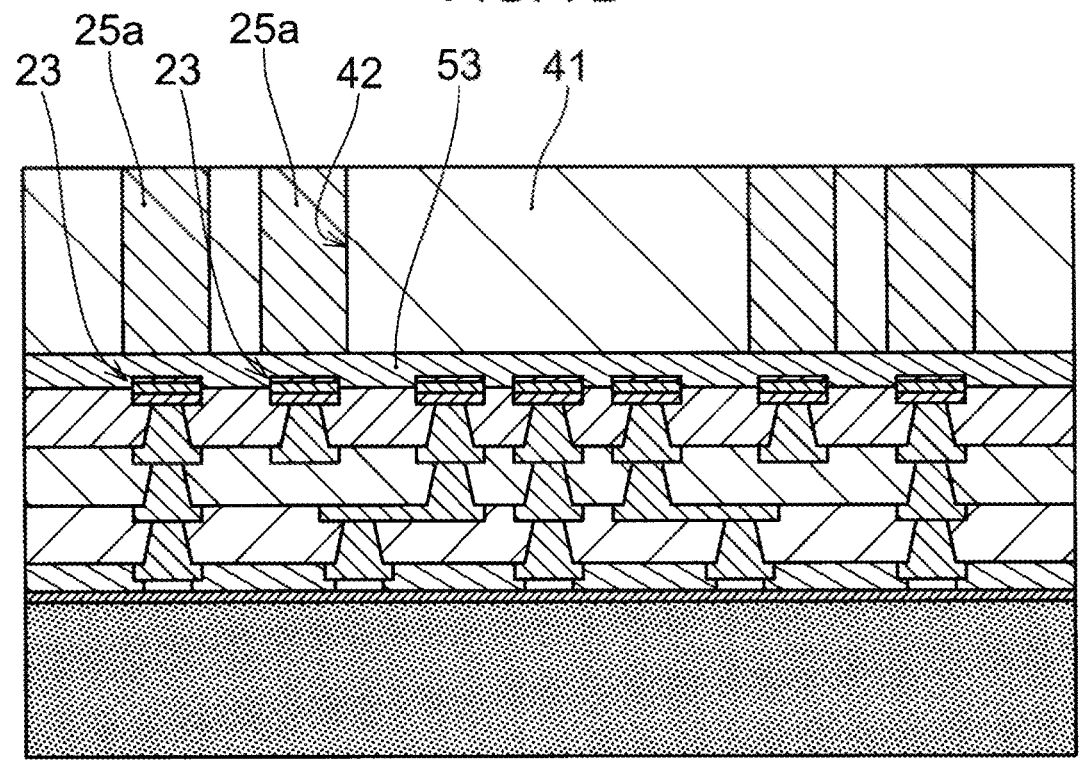
FIG. 7D illustrates a method for manufacturing a printed wiring board according to the embodiment of the present invention.

In the case where the printed wiring board 101 illustrated in FIG. 4A is formed, before the metal film 53 is removed (see FIG. 7A), the conductor posts 25 (see FIG. 4A) are formed on the third conductor pads 23 that are formed in an outer peripheral portion of the second surface (10T) of the laminate 10. First, as illustrated in FIG. 7B, a plating resist layer 41 is formed on the entire surface of the metal film 53. As illustrated in FIG. 7C, openings 42 are formed in the plating resist layer 41 at positions where the conductor posts 25 are to be formed. The metal film 53 on the third conductor pads 23 is exposed on bottom surfaces of the openings 42. The openings 42 are formed, for example, by exposure and development. Therefore, the openings 42 having substantially vertical wall surfaces are formed. The plating resist layer 41 can be formed to have a thickness substantially equal to or slightly larger than the length of the conductor posts 25. As illustrated in FIG. 7D, the plating films (25a) are formed, by electrolytic plating using the metal film 53 as a power feeding layer, on the metal film 53 exposed in the openings 42 of the plating resist layer 41. The plating films (25a) are respectively connected to the third conductor pads 23 via the metal film 53. As described above, the openings 42 of the plating resist layer 41 can have substantially vertical wall surfaces. Therefore, the plating films (25a) can also be each formed with substantially the same width in a height direction.

Figure 7E:
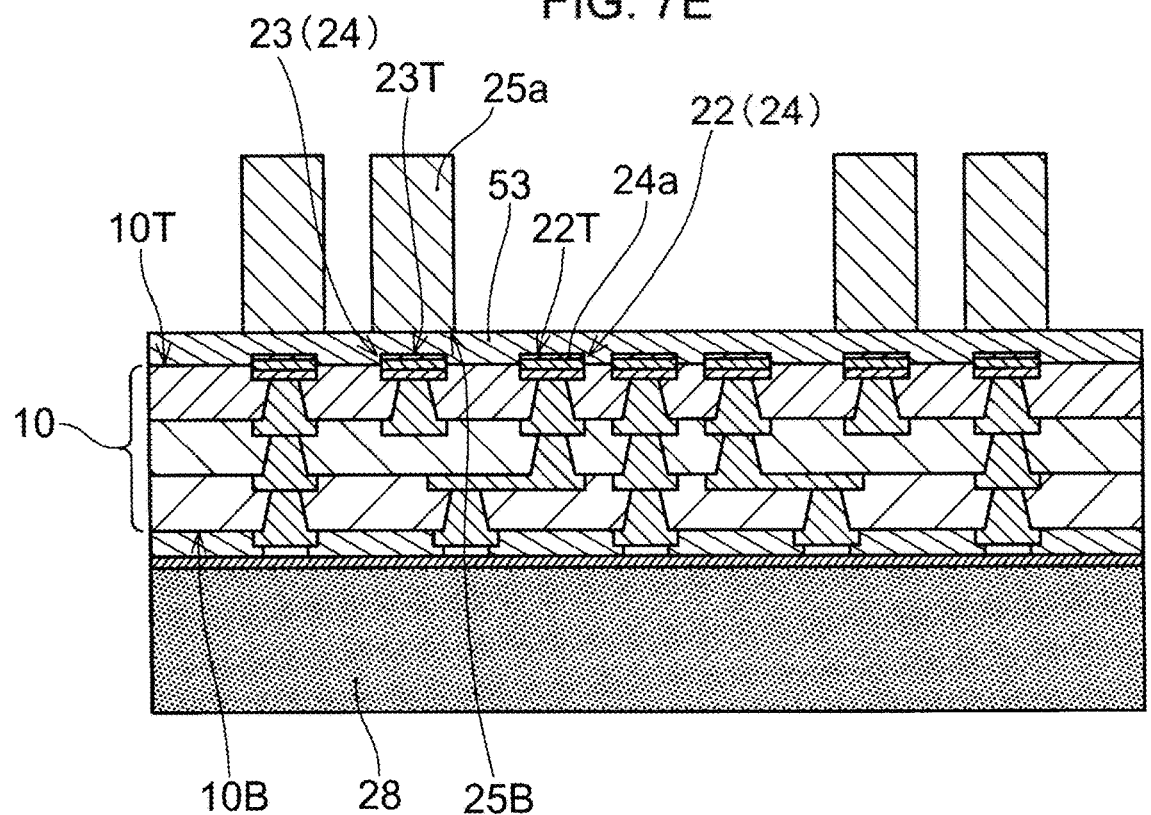
FIG. 7E illustrates a method for manufacturing a printed wiring board according to the embodiment of the present invention.

Thereafter, as illustrated in FIG. 7E, the plating resist layer 41 is removed. Next, the metal film 53 exposed by the removal of the plating resist layer 41 is removed by etching. The plating films (25a) respectively mask portions of the metal film 53 below the plating films (25a) during the removal of the metal film 53 by etching. Portions of the metal film 53 that are respectively masked by the plating films (25a) on the third conductor pads 23 remain without being removed. Further, a diameter of an interface (25B) between each of the plating films (25a) and the metal film 53 is larger than a diameter of the upper surface (23T) of each of the third conductor pads 23. Therefore, the metal film 53 remains also on the side surfaces of the protruding portions of the third conductor pads 23 that protrude from the second surface (10T) after the removal of the metal film 53. The conductor posts 25 are formed by the portions of the metal film 53 that remain without being removed and the plating films (25a). The printed wiring board 101 illustrated in FIG. 4A is completed.

A material of the conductor posts 25 is not particularly limited. Copper that is inexpensive and low in electrical resistance is preferable. Examples of a plating solution for forming the plating films (25a) composed of copper include a copper sulfate plating solution and the like. A length (thickness of plating) of each of the plating films (25a) can be controlled by a plating time. The conductor posts 25 can be formed to have any height. Preferably, the plating films (25a) and the metal film 53 are formed of the same material. The conductor posts 25 having high strength can be formed.

It is also possible that, support plates 28 of laminates 10, to each of which a support plate 28 is adhered, are bonded to each other, and, for example, subsequent processes of printed wiring boards 101 on the support plates 28 are simultaneously performed. For example, the formation of the conductor posts 25 on the third conductor pads 23 can be simultaneously performed on the laminates 10 on both sides. Specifically, after the process of adhering the support plate 28 to the laminate 10 illustrated in FIG. 6K, two support plates 28 are bonded to each other such that the exposed surfaces of the support plates 28 on opposite sides of the solder resist layers 27 facing each other. For example, the support plates 28 can be bonded to each other by a peelable adhesive or the like. Or, it is also possible that the two support plates 28 sandwich another support plate and are respectively bonded to both sides of the other support plate. Then, the conductor posts 25 are formed using the method described with reference to FIG. 7A-7E on the third conductor pads 23 of each of the laminates 10 on the two bonded support plates 28. Thereafter, for example, after removing the metal films 53, the two support plates 28 are separated. Since the conductor posts 25 can be substantially simultaneously formed on the laminates 10 on the both sides, printed wiring boards can be more efficiently manufactured.

Figure 7F:
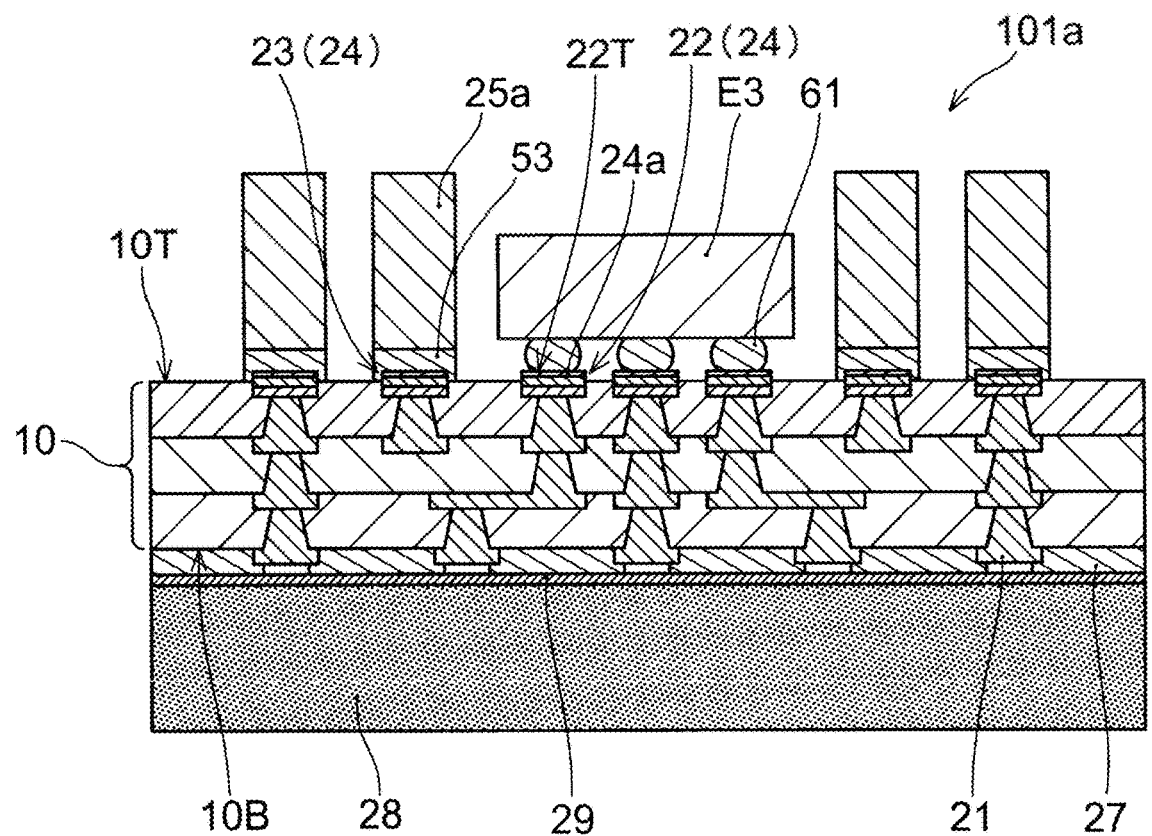
FIG. 7F illustrates an example of mounting an electronic component in a method for manufacturing a printed wiring board according to the embodiment of the present invention.
Figure 7G:
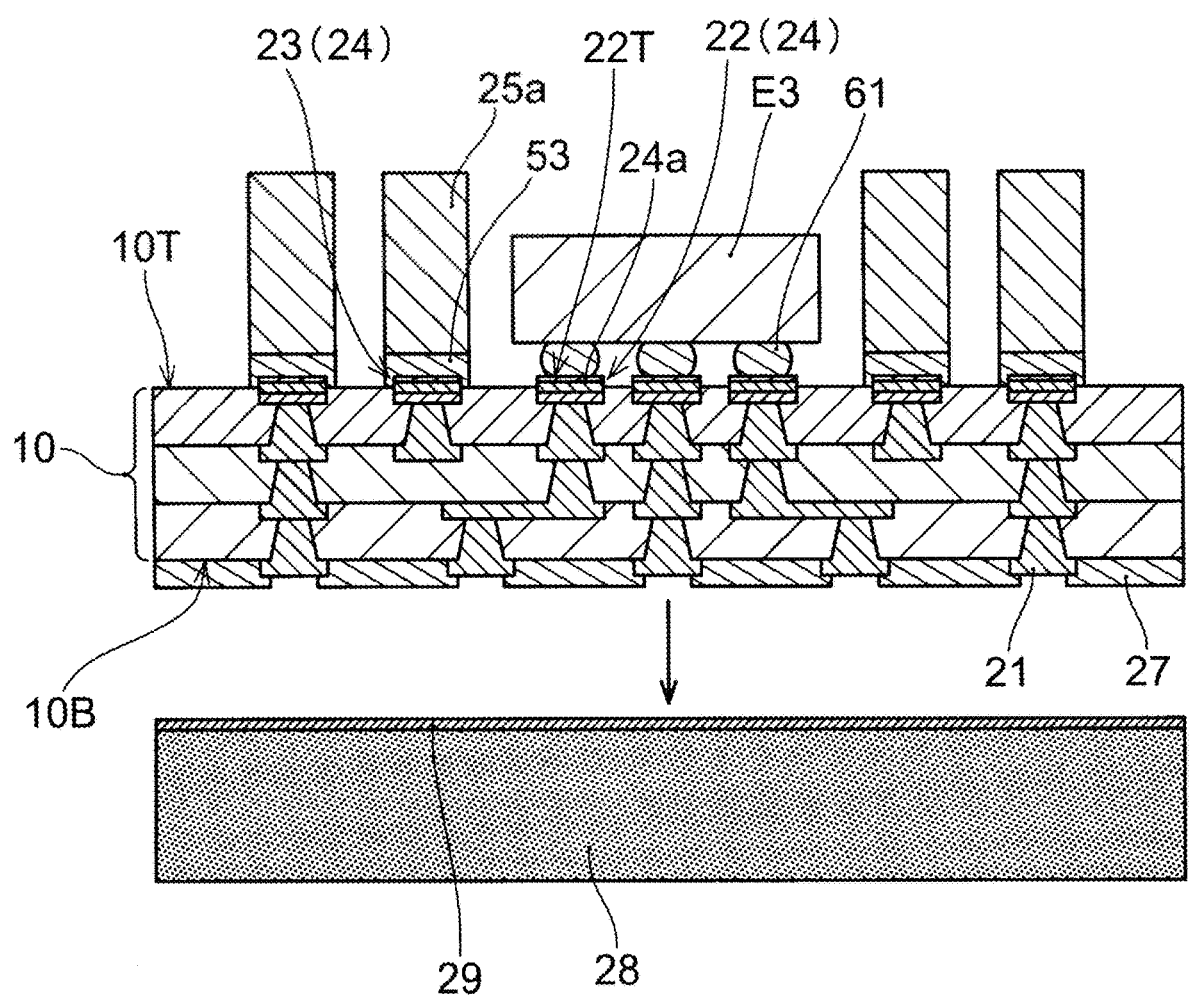
FIG. 7G illustrates an example of removing a support plate in a method for manufacturing a printed wiring board according to the embodiment of the present invention.

In the case where the printed wiring board (101a) having an electronic component illustrated in FIG. 4B is manufactured, the electronic component (E3) is mounted on the second conductor pads 22 of the completed printed wiring board 101. As illustrated in FIG. 7F, the electronic component (E3) is connected to the second conductor pads 22 via the bonding members 61 using the same method as that described with reference to FIG. 5N, such as solder reflow. Further, a motherboard or another printed wiring board (not illustrated in the drawings) may be connected to the end surfaces (25T) of the conductor posts 25 so as to form a part of a semiconductor package. Then, as illustrated in FIG. 7G, the support plate 28 is peeled off from the laminate 10 as appropriate using the same method as that described with reference to FIG. 5O.

Methods for manufacturing the printed wiring boards of the embodiments are not limited to the methods described with reference to FIG. 5A-5O, FIG. 6A-6L and FIG. 7A-7G. The conditions, processing order and the like of the methods may be arbitrarily modified. Further, it is also possible that a specific process is omitted or another process is added.

The multilayer wiring board of Japanese Patent Laid-Open Publication No. 2009-224739 does not have a core substrate and is formed from only the insulating layers, the wiring layers, and the protective film, which are mainly formed of resin, and warping is likely to occur during mounting of a semiconductor element or the like. Further, since the connection pads protrude from the insulating layer that forms the surface, when a solder resist layer is not formed, an insulator is not interposed between adjacent connection pads. Therefore, a short-circuit defect between adjacent pads is likely to occur due to wet spreading of a bonding material such as solder. In particular, for a wiring board in which connection pads are provided at a fine pitch, it may be difficult to form a solder resist between adjacent connection pads. A short-circuit defect is more likely to occur.

A printed wiring board according to an embodiment of the present invention includes a laminate that is formed from alternately conductor layers and resin insulating layers and has conductor layers laminated on both sides of at least one resin insulating layer. The laminate has a first surface and a second surface that is on the opposite side of the first surface, and has multiple first conductor pads that are formed on the first surface, and multiple second conductor pads that are embedded in a first resin insulating layer that forms the second surface, one surface of each of the second conductor pads being exposed on the second surface side. A solder resist layer is formed on the first surface of the laminate. A support plate is provided on the solder resist layer.

A method for manufacturing a printed wiring board according to an embodiment of the present invention includes: preparing a base plate, a metal film being provided on a surface of the base plate; forming a metal layer including multiple conductor pads on the metal film; forming a laminate including at least one pair of a resin insulating layer and a conductor layer by forming, on the metal film, a resin insulating layer covering exposed surfaces of the conductor pads including side surfaces and further laminating a conductor layer on the resin insulating layer, the laminate having a second surface facing the metal film and a first surface that is on the opposite side of the second surface; forming a solder resist layer on the first surface of the laminate; bonding a support plate to the first surface of the laminate via the solder resist layer; removing the base plate; and exposing one surface of each of the conductor pads on the opposite side of the support plate by removing the metal film.

According to an embodiment of the present invention, the support plate is provided, and warping or the like in the printed wiring board is suppressed, an electronic component can be easily and stably mounted on the conductor pads. Further, since a solder resist layer is formed on the support plate side and the conductor pads on the opposite side of the support plate are at least partially embedded in a resin insulating layer, occurrence of a short-circuit defect between the conductor pads can be suppressed on both sides of the printed wiring board. Connection reliability between an electronic component and the printed wiring board is expected to be high. Further, the conductor pads can be arrayed at a fine pitch on the surface on the opposite side of the support plate.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
    a laminate comprising a plurality of first conductor pads on a first surface side of the laminate and a plurality of second conductor pads on a second surface side of the laminate; and
    a solder resist layer formed on the first surface side of the laminate and having a plurality of openings formed such that the openings are exposing the first conductor pads respectively,
    wherein the laminate includes a resin insulating layer and has a first surface on the first surface side and a second surface on the second surface side on an opposite side with respect to the first surface of the laminate, each of the second conductor pads has an embedded portion embedded in the second surface of the laminate and a protruding portion protruding from the second surface of the laminate such that the second conductor pads have surfaces exposed and protruding from the second surface of the laminate and that the embedded portion has a width that is substantially equal to a width of the protruding portion in a thickness direction of the laminate, the plurality of second conductor pads is formed on a center side of the second surface of the laminate, the laminate includes a plurality of third conductor pads formed on the second surface side of the laminate such that the third conductor ads are positioned on an outer peripheral side than the plurality of second conductor pads, embedded in the second surface of the laminate and have surfaces exposed from the second surface of the laminate respectively, and the plurality of second conductor pads is formed such that the plurality of second conductor pads has a pitch that is smaller than a pitch of the plurality of third conductor pads.

2. A printed wiring board according to claim 1, wherein the laminate includes a via conductor structure penetrating from the first surface to the second surface of the laminate such that the via conductor structure comprises at least one via conductor formed in the resin insulating layer and tapering from the first surface side toward the second surface side of the laminate.

3. A printed wiring board according to claim 1, wherein the plurality of first conductor pads is formed on the first surface of the laminate.

4. A printed wiring board according to claim 1, wherein the second surface of the laminate is not covered with a solder resist layer.

5. A printed wiring board according to claim 1, further comprising:
    an electronic component connected to the plurality of second conductor pads such that the electronic component is mounted on the second surface side of the laminate.

6. A printed wiring board according to claim 1, wherein the plurality of second conductor pads is formed such that each of the second conductor pads comprises a dissimilar metal layer comprising mutually different metal layers.

7. A printed wiring board according to claim 6, wherein the dissimilar metal layer comprises a copper plating layer and a corrosion resistant plating layer formed on the copper plating layer.

8. A printed wiring board according to claim 1, wherein the plurality of second conductor pads is formed such that the surfaces of the second conductor pads have a height in a range of 2 µm to 10 µm from the second surface of the laminate.

9. A printed wiring board according to claim 1, wherein the plurality of third conductor pads is formed such that each of the third conductor pads comprises a dissimilar metal layer comprising mutually different metal layers.

10. A printed wiring board according to claim 9, wherein the dissimilar metal layer of each of the third conductor pads comprises a copper plating layer and a corrosion resistant plating layer formed on the copper plating layer.

11. A printed wiring board according to claim 1, further comprising:
    a plurality of conductor posts formed on the second surface side of the laminate such that the conductor posts are formed on the third conductor pads respectively.

12. A printed wiring board according to claim 11, wherein the conductor posts comprise metal film layer portions formed in contact with the third conductor pads and plating layer portions formed on the metal film layer portions respectively.

13. A printed wiring board according to claim 12, wherein the plurality of conductor posts has a height in a range of 50 µm to 200 µm.

14. A printed wiring board according to claim 11, wherein the plurality of conductor posts is formed such that the plurality of conductor posts has a diameter that is greater than a diameter of the plurality of third conductor pads.

15. A printed wiring board according to claim 11, wherein the laminate includes a via conductor structure penetrating from the first surface to the second surface of the laminate such that the via conductor structure, one of the conductor posts and one of the first conductor pads are formed in overlapping positions and that the via conductor structure is connecting the one of the conductor posts and the one of the first conductor pads.

16. A printed wiring board according to claim 1, wherein the plurality of third conductor pads is formed such that the surfaces of the third conductor pads are protruding from the second surface of the laminate.

17. A printed wiring board according to claim 1, wherein the resin insulating layer of the laminate forms the second surface of the laminate, and the laminate includes a plurality of via conductors formed in the resin insulating layer such that each of the via conductors is connected to the embedded portion of a respective one of the second pads in the resin insulating layer.

18. A printed wiring board according to claim 2, wherein the plurality of first conductor pads is formed on the first surface of the laminate.

19. A printed wiring board according to claim 2, wherein the second surface of the laminate is not covered with a solder resist layer.

20. A printed wiring board according to claim 2, further comprising:

an electronic component connected to the plurality of second conductor pads such that the electronic component is mounted on the second surface side of the laminate.

\* \* \* \* \*